(12) United States Patent
Yamamoto et al.

(10) Patent No.: US 8,835,943 B2
(45) Date of Patent: Sep. 16, 2014

(54) LIGHT-EMITTING ELEMENT, LIGHT-EMITTING DEVICE, DISPLAY DEVICE, AND ELECTRONIC APPARATUS

(75) Inventors: Hidetoshi Yamamoto, Suwa (JP); Tetsuji Fujita, Chino (JP); Koya Shiratori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/226,070

(22) Filed: Sep. 6, 2011

(65) Prior Publication Data

US 2012/0056213 A1 Mar. 8, 2012

(30) Foreign Application Priority Data

Sep. 6, 2010 (JP) ................. 2010-199311
Sep. 27, 2010 (JP) ................. 2010-215080
Sep. 27, 2010 (JP) ................. 2010-215081

(51) Int. Cl.
*H01L 29/18* (2006.01)
*H01L 33/00* (2010.01)
*H01L 51/50* (2006.01)
*C09K 11/06* (2006.01)
*H01L 51/00* (2006.01)

(52) U.S. Cl.
CPC .... *H01L 51/5048* (2013.01); *C09K 2211/1007* (2013.01); *H01L 51/5052* (2013.01); *H01L 51/5096* (2013.01); *H01L 51/0059* (2013.01); *C09K 11/06* (2013.01); *C09K 2211/1011* (2013.01)
USPC .............. 257/88; 257/103; 257/101

(58) Field of Classification Search
USPC .......... 257/88, 99, 40, 79, 642–643, E51.001, 257/E51.022, E33.012
See application file for complete search history.

(56) References Cited

U.S. PATENT DOCUMENTS

| 5,601,903 A | 2/1997 | Fujii et al. |
| 5,616,427 A * | 4/1997 | Tada ............................. 428/690 |
| 5,989,737 A | 11/1999 | Xie et al. |
| 6,344,283 B1 | 2/2002 | Inoue et al. |
| 2001/0005021 A1 | 6/2001 | Fukuyama et al. |

(Continued)

FOREIGN PATENT DOCUMENTS

| JP | A-7-65958 | 3/1995 |
| JP | A-10-255985 | 9/1998 |

(Continued)

OTHER PUBLICATIONS

Viktor V. Jarikov, "Quantum efficiency improvement in anthracene-based organic lightemitting diodes codoped with a hole-trapping material", Appl. Phys. Lett. 92, 244103 (2008); doi: 10.1063/1.2939099, Introduction.*

*Primary Examiner* — Steven Loke
*Assistant Examiner* — Juanita B Rhodes
(74) *Attorney, Agent, or Firm* — Oliff PLC

(57) ABSTRACT

A light-emitting element includes: an anode; a cathode; a light-emitting layer which is provided between the anode and the cathode and emits light as the anode and the cathode are electrically connected to each other; and an organic layer which is provided between the anode and the light-emitting layer to come in contact with both layers. The organic layer has a first function of transporting holes and a second function of preventing electrons infiltrating from the light-emitting layer from staying in the organic layer.

17 Claims, 8 Drawing Sheets

(56) References Cited

U.S. PATENT DOCUMENTS

| | | | |
|---|---|---|---|
| 2003/0049489 A1* | 3/2003 | Hatwar et al. | 428/690 |
| 2004/0061108 A1 | 4/2004 | Fukuyama et al. | |
| 2005/0056859 A1* | 3/2005 | Liu et al. | 257/103 |
| 2007/0148493 A1* | 6/2007 | Yoneyama et al. | 428/690 |
| 2008/0185957 A1* | 8/2008 | Kato et al. | 313/503 |
| 2009/0294778 A1* | 12/2009 | Mitsuya | 257/79 |

FOREIGN PATENT DOCUMENTS

| | | |
|---|---|---|
| JP | A-2003-51388 | 2/2003 |
| JP | B2-3654909 | 3/2005 |
| JP | A-2005-101017 | 4/2005 |
| JP | A-2009-64596 | 3/2009 |
| JP | A-2009-76528 | 4/2009 |
| JP | A-2009-295305 | 12/2009 |

* cited by examiner

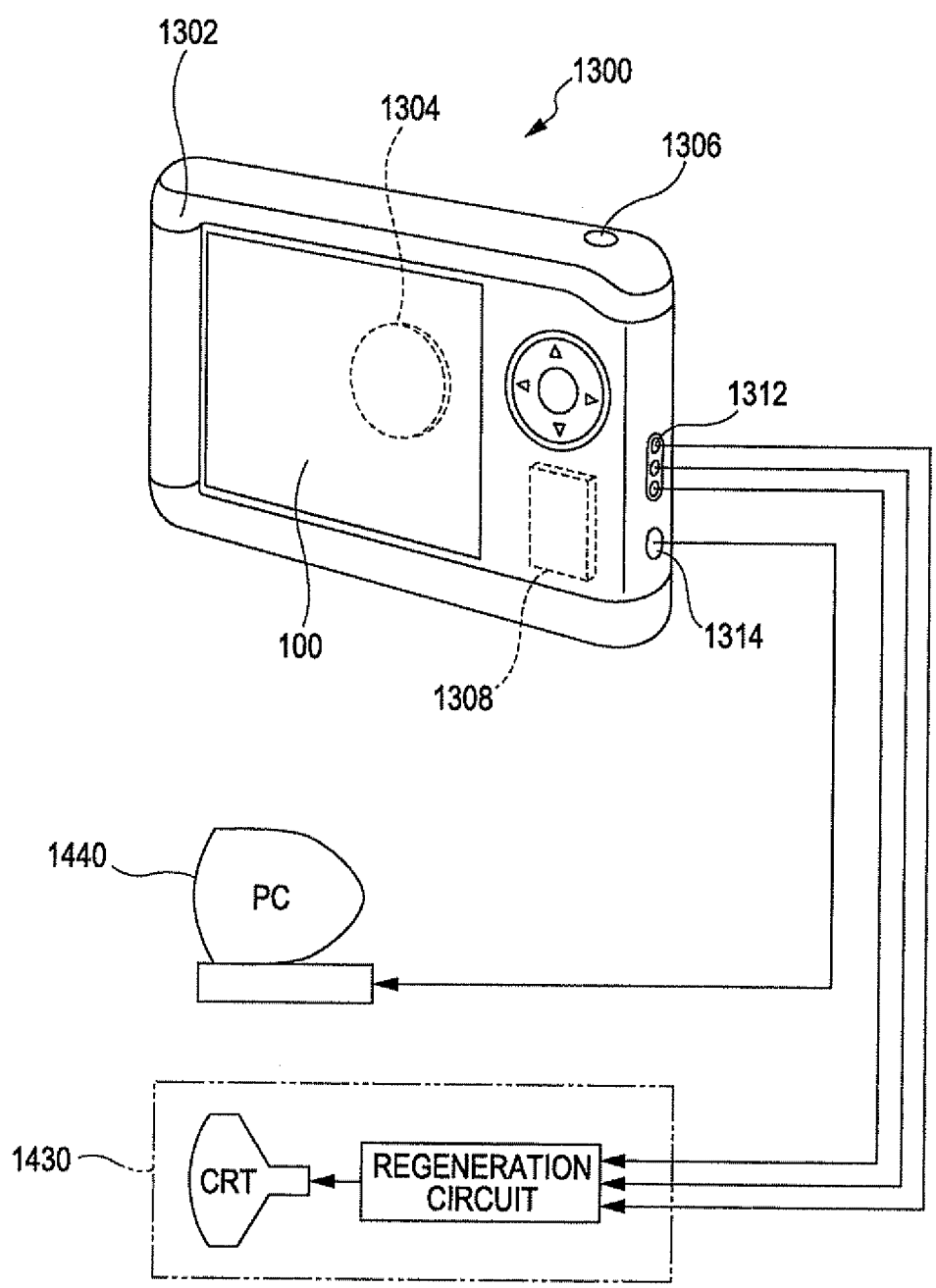

LIGHT-EMITTING ELEMENT, LIGHT-EMITTING DEVICE, DISPLAY DEVICE, AND ELECTRONIC APPARATUS

BACKGROUND

1. Technical Field

The present invention relates to a light-emitting element, a light-emitting device, a display device, and an electronic apparatus.

2. Related Art

An organic electroluminescence element (a so-called organic EL element) is a light-emitting element having a structure in which at least one luminescent organic layer is interposed between an anode and a cathode as a light-emitting layer. In such a light-emitting element, by applying an electric field between the cathode and the anode, electrons are injected into the light-emitting layer from the cathode side and holes are injected into the light-emitting layer from the anode side. The electrons and the holes recombine in the light-emitting layer thereby generating an exciton. When the exciton returns to the ground state, a corresponding amount of energy is emitted as light.

In such a light-emitting element, in general, a hole injection layer and a hole transport layer are provided between the anode and the light-emitting layer in order to enhance a hole-injecting property or a hole-transporting property (for example, refer to Japanese Patent No. 3654909).

In addition, in the light-emitting element, by adjusting the levels of the HOMO (highest occupied molecular orbital) and the LUMO (lowest unoccupied molecular orbital) of the hole transport layer, the hole transport layer blocks the electrons from the cathode side (the light-emitting layer side), and the electrons and the holes are confined in the light-emitting layer, such that enhancement of a light-emission efficiency is achieved.

However, in the light-emitting element according to the related art, there are problems in that the hole transport layer cannot sufficiently block electrons from the cathode side, and the hole transport layer or the hole injection layer is deteriorated by the electrons passing through the hole transport layer with long-term use. These problems become significant since a function of blocking the electrons in the hole transport layer (electron-blocking effect) is degraded by a band bending effect as a current density is increased. Therefore, a long lifetime of a light-emitting element with high luminance which requires a high-density current cannot be achieved.

In addition, in order to increase the electron-blocking effect, use of a material having an energy difference between the HOMO and LUMO for the hole transport layer is considered. However, this is difficult in practice.

SUMMARY

An advantage of some aspects of the invention is that it provides a light-emitting element capable of achieving excellent light-emitting efficiency and a long lifetime even when being driven at a current of a high density, a light-emitting device, a display device, and an electronic apparatus, each including the light-emitting element.

According to an aspect of the invention, there is provided a light-emitting element including: an anode; a cathode; a light-emitting layer which is provided between the anode and the cathode and emits light as the anode and the cathode are electrically connected to each other; and an organic layer which is provided between the anode and the light-emitting layer to come in contact with both layers, wherein the organic layer has a first function of transporting holes and a second function of preventing electrons from staying in the organic layer.

In the light-emitting element according to the aspect of the invention, the organic layer has the first function of transporting holes and thus can efficiently transport the holes to the light-emitting layer from the anode. Therefore, the light-emission efficiency of the light-emitting element can be enhanced.

In particular, in the light-emitting element according to the aspect of the invention, since the organic layer has the second function of preventing electrons infiltrating from the light-emitting layer from staying in the organic layer, even though electrons infiltrate (are injected) into the organic layer from the light-emitting layer, the electrons are prevented (impeded) from staying in the organic layer. As a result, the organic layer can be prevented from being deteriorated by the electrons. Therefore, the light-emitting element can achieve a long lifetime even when being driven at a current of a high current density.

In the light-emitting element according to the aspect of the invention, it is preferable that the organic layer exhibit a function of blocking electrons by the first function.

Accordingly, the organic layer can block electrons from the light-emitting layer while transporting holes from the anode to the light-emitting layer. Therefore, the holes and the electrons are efficiently confined in the light-emitting layer, thereby enhancing the light-emission efficiency.

Even though the organic layer has the function of blocking electrons as such, there may be a case where during driving at a high current density, the organic layer cannot block all electrons and as a result, the electrons infiltrate (are injected) into the organic layer. Even in this case, in the light-emitting element according to the aspect of the invention, since the organic layer has the second function of preventing electrons from staying in the organic layer, the electrons that are not blocked by the organic layer and infiltrate into the organic layer can be excluded (for example, passed, or neutralized (extinguished)) from the organic layer.

In the light-emitting element according to the aspect of the invention, it is preferable that the organic layer contains an amine-based material and accordingly exhibit the first function.

The amine-based material has an excellent hole-transporting property. Therefore, the organic layer containing the amine-based materials can rapidly transport electrons from the anode to the light-emitting layer, that is, can appropriately exhibit the first function.

In the light-emitting element according to the aspect of the invention, it is preferable that the entirety of the organic layer contains an electron-transporting material that has a property of transporting electrons and accordingly exhibit the second function.

In this case, since the entirety of the organic layer contains the electron-transporting material and comes in contact with both the anode and the light-emitting layer, even though electrons infiltrate (are injected) into the organic layer from the light-emitting layer, the electrons can be rapidly transported and passed to the anode side by the organic layer. Accordingly, the second function of preventing the electrons from staying in the organic layer is more reliably exhibited. As a result, the organic layer can be prevented from being deteriorated by the electrons.

Therefore, the light-emitting element can achieve a longer lifetime even when being driven at a current of a high current density.

In the light-emitting element according to the aspect of the invention, it is preferable that the electron-transporting material be an acene-based material.

The acene-based material has an excellent electron-transporting property. Therefore, the organic layer containing the acene-based material can rapidly transport electrons from the light-emitting layer to the anode. In addition, the acene-based material has excellent resistance to electrons. Therefore, deterioration of the organic layer by the electrons can be prevented or suppressed.

In the light-emitting element according to the aspect of the invention, it is preferable that the acene-based material be made of at least one of an anthracene-based material and a naphthacene-based material.

The acene-based material has an excellent electron-transporting property and a film of the acene-based material can be formed relatively simply with high film quality.

In the light-emitting element according to the aspect of the invention, it is preferable that a content of the electron-transporting material in the organic layer be equal to or greater than 30 wt % and equal to or smaller than 70 wt %.

Accordingly, the balance between the electron-transporting property and the hole-transporting property of the organic layer can be enhanced to be appropriate. In addition, in the case where the organic layer has an electron-blocking property, the balance between the electron-blocking property and the electron-transporting property of the organic layer can be enhanced to be appropriate.

In the light-emitting element according to the aspect of the invention, it is preferable that the organic layer be made of a mixed material in which the acene-based material and the amine-based material are mixed with each other, and accordingly exhibit the first and second functions.

Accordingly, the balance between the hole-transporting property and the electron-transporting property in the organic layer can be relatively simply adjusted in an appropriate range.

In the light-emitting element according to the aspect of the invention, it is preferable that the organic layer include a hole injection layer which is provided between the anode and the light-emitting layer to come in contact with the anode and contains a hole-injecting material, and a hole transport layer which is provided between the hole injection layer and the light-emitting layer to come in contact with both layers and contains a hole-transporting material, and the electron-transporting material be contained in each of the hole injection layer and the hole transport layer.

Accordingly, deterioration of the hole injection layer and the hole transport layer by the electrons can be prevented while providing good properties of injecting and transporting holes from the anode.

In the light-emitting element according to the aspect of the invention, it is preferable that the organic layer include a hole injection layer which is provided between the anode and the light-emitting layer to come in contact with both layers and contain a hole-injecting material, and the electron-transporting material be contained in the hole injection layer.

Accordingly, deterioration of the hole injection layer by the electrons can be prevented while providing good properties of injecting holes from the anode.

In the light-emitting element according to the aspect of the invention, it is preferable that the organic layer include a hole transport layer which is provided between the anode and the light-emitting layer to come in contact with both layers and contain a hole-transporting material, and the electron-transporting material be contained in the hole transport layer.

Accordingly, deterioration of the hole transport layer by the electrons can be prevented while providing good properties of transporting holes from the anode.

In the light-emitting element according to the aspect of the invention, it is preferable that an average thickness of the organic layer be equal to or greater than 20 nm and equal to or smaller than 100 nm.

Accordingly, deterioration of the organic layer due to electrons can be prevented while suppressing the driving voltage.

In the light-emitting element according to the aspect of the invention, it is preferable that the organic layer contains an electron-trapping material having a property of trapping electrons and accordingly exhibit the second function.

In this case, the electron-trapping material can trap the electrons from the light light-emitting layer and neutralize (extinguish) the electrons. Accordingly, the second function of preventing the electrons from staying in the organic layer is more reliably exhibited. As a result, the organic layer can be prevented from being deteriorated by the electrons. Therefore, the light-emitting element can achieve a longer lifetime even when being driven at a current of a high current density.

In the light-emitting element according to the aspect of the invention, it is preferable that the electron-trapping material be an acene-based material.

The acene-based material has an appropriate electron-trapping property. Therefore, an increase in the driving voltage of the light-emitting element can be suppressed. In addition, the acene-based material has excellent resistance to electrons and holes. Therefore, deterioration of the organic layer by the electrons and the holes can be prevented, thereby achieving a long lifetime of the light-emitting element. Moreover, the acene-based material itself is less likely to emit light, so that the acene-based material is prevented from having an adverse effect on the light emission spectrum of the entire light-emitting element 1C.

It is preferable that the organic layer have an electron neutralization layer containing a hole-transporting material and the electron-trapping material.

In this case, the electron neutralization layer is in the thickness direction of the organic layer and thus can neutralize (extinguish) the electrons from the light-emitting layer. Accordingly, the second function of preventing the electrons from staying in the organic layer can be more reliably exhibited.

In the light-emitting element according to the aspect of the invention, it is preferable that the hole-transporting material contained in the electron neutralization layer contain an amine-based material.

The amine-based material has an excellent hole-transporting property. Therefore, the electron neutralization layer containing the amine-based materials can rapidly transport holes from the anode to the light-emitting layer.

In the light-emitting element according to the aspect of the invention, it is preferable that the electron neutralization layer be made of a mixed material in which the acene-based material and the amine-based material are mixed with each other.

Accordingly, the balance between the hole-transporting property and the electron-transporting property in the electron neutralization layer can be relatively simply adjusted in an appropriate range.

In the light-emitting element according to the aspect of the invention, it is preferable that the acene-based material be an anthracene-based material.

The acene-based material has an appropriate electron-trapping property and a film of the acene-based material can be formed relatively simply with high film quality.

In the light-emitting element according to the aspect of the invention, it is preferable that the light-emitting layer contain tetracene derivatives as a host material and contain diindenoperylene derivatives as a guest material.

Accordingly, the light-emitting layer can efficiently perform emission of red light.

In the light-emitting element according to the aspect of the invention, it is preferable that a content of the electron-trapping material in the electron neutralization layer be equal to or greater than 30 wt % and equal to or smaller than 70 wt %.

Accordingly, the electron-trapping property of the electron neutralization layer can be enhanced to be appropriate while suppressing the driving voltage of the light-emitting element.

In the light-emitting element according to the aspect of the invention, it is preferable that an average thickness of the electron neutralization layer be equal to or greater than 20 nm and equal to or smaller than 60 nm.

Accordingly, the electron-trapping property of the electron neutralization layer can be enhanced to be appropriate while suppressing the driving voltage of the light-emitting element.

In the light-emitting element according to the aspect of the invention, it is preferable that the organic layer further include a hole injection layer provided between the anode and the light-emitting layer and a hole transport layer provided between the hole injection layer and the light-emitting layer, and the electron neutralization layer be provided between the hole transport layer and the light-emitting layer to come in contact with the light-emitting layer.

In this case, the hole injection layer on the anode side with respect to the electron neutralization layer can be prevented from being deteriorated by the electrons. Therefore, the light-emitting element can achieve a long lifetime even when being driven at a current of a high current density. In addition, as the electron neutralization layer comes in contact with both the hole injection layer and the hole transport layer, the electron neutralization layer can achieve an excellent hole-transporting property. In addition, the electrons infiltrating the hole transport layer can be rapidly neutralized (extinguished) by the electron neutralization layer.

In the light-emitting element according to the aspect of the invention, it is preferable that the organic layer further include a hole injection layer provided between the anode and the light-emitting layer and a hole transport layer provided between the hole injection layer and the light-emitting layer, and the electron neutralization layer be provided between the hole injection layer and the hole transport layer to come in contact with both the layers.

In this case, hole injection layer provided on the anode side with respect to the electron neutralization layer can be prevented from being deteriorated by the electrons. Therefore, the light-emitting element can achieve a long lifetime even when being driven at a current of a high current density. In addition, since the electron neutralization layer comes in contact with both the hole injection layer and the hole transport layer, the electron neutralization layer can achieve an excellent hole-transporting property. In addition, the electron neutralization layer can rapidly neutralize (extinguish) the electrons infiltrating into the hole transport layer.

In the light-emitting element according to the aspect of the invention, it is preferable that the hole transport layer have a function of blocking electrons.

Accordingly, the hole transport layer can block electrons from the light-emitting layer while transporting holes from the electron neutralization layer to the light-emitting layer. Therefore, the holes and the electrons are efficiently confined in the light-emitting layer, thereby enhancing the light-emission efficiency.

According to another aspect of the invention, there is provided a light-emitting device including the light-emitting element according to the above aspect of the invention.

The light-emitting device includes the light-emitting element having a long lifetime, and thus has excellent reliability.

According to still another aspect of the invention, there is provided a display device including the light-emitting device according to the aspect of the invention.

The display device can display images with high quality for a long time and has excellent reliability.

According to still further another aspect of the invention, there is provided an electronic apparatus including the display device according to the aspect of the invention.

The electronic apparatus has excellent reliability.

BRIEF DESCRIPTION OF THE DRAWINGS

The invention will be described with reference to the accompanying drawings, wherein like numbers reference like elements.

FIG. 9 is a perspective view showing the configuration of a digital still camera to which the electronic apparatus of the invention is applied.

DESCRIPTION OF EXEMPLARY EMBODIMENTS

Preferred embodiments of a light-emitting element, a light-emitting device, a display device, and an electronic apparatus of the invention will now be described with reference to the attached drawings.

First Embodiment

Figure 1:
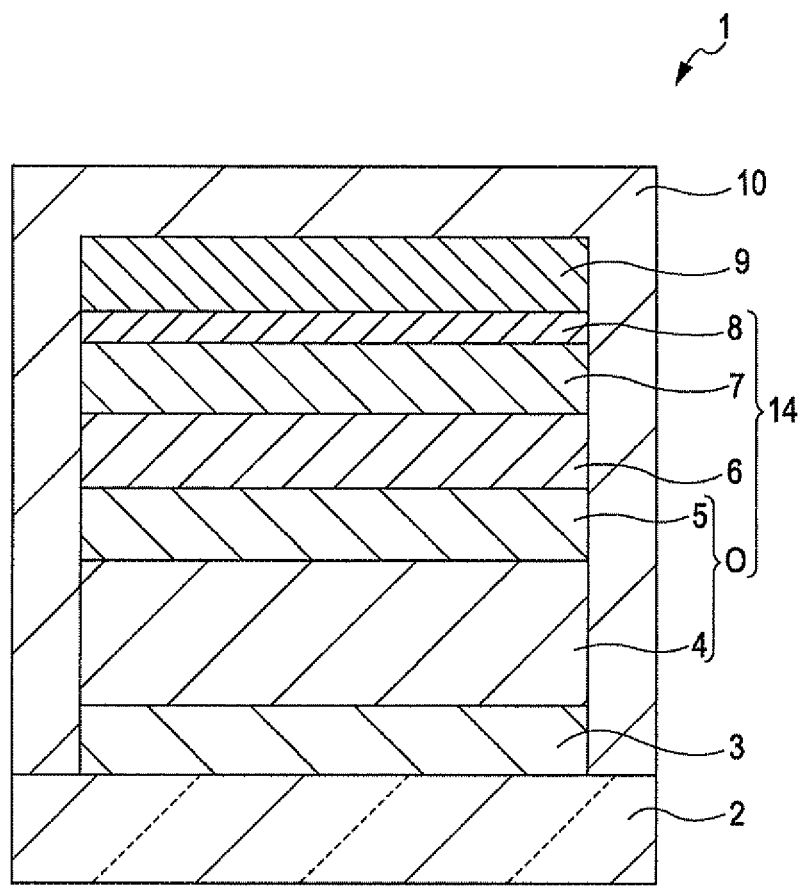
FIG. 1 is a cross-sectional view schematically showing a light-emitting element according to a first embodiment of the invention.

FIG. 1 is a cross-sectional view schematically showing a light-emitting element according to a first embodiment of the invention. In the following description, for the convenience of description, the upper side in FIG. 1 represents "up", and the lower side in FIG. 1 represents "down".

A light-emitting element (electroluminescence element) 1 shown in FIG. 1 is configured so that an anode 3, a hole injection layer 4, a hole transport layer 5, a light-emitting layer 6, an electron transport layer 7, an electron injection layer 8, and a cathode 9 are laminated in this order. That is, in the light-emitting element 1, between the anode 3 and the cathode 9, a laminate 14 in which the hole injection layer 4, the hole transport layer 5, the light-emitting layer 6, the electron transport layer 7, and the electron injection layer 8 are laminated in this order from the anode 3 side to the cathode 9 side is interposed. In addition, in this embodiment, a laminate including the hole injection layer 4 and the hole transport layer 5 constitutes an organic layer O having a function of transporting holes from the anode 3 to the light-emitting layer 6.

The entire light-emitting element 1 is provided on a substrate 2 and is sealed with a sealing member 10.

In the light-emitting element 1, as a driving voltage is applied to the anode 3 and the cathode 9, electrodes are supplied (injected) from the cathode 9 side to the light-emitting layer 6 and holes are supplied (injected) from the anode 3 side to the light-emitting layer 6. In addition, in the light-emitting layer 6, the electrons and the holes are recombined, and an exciton is generated by energy released by this recombination. When the exciton returns to the ground state, energy (fluorescence or phosphorescence) is released (emitted). Accordingly, the light-emitting element 1 emits light.

Here, in the light-emitting element 1, the laminate (the organic layer O) including the hole injection layer 4 and the hole transport layer 5 can exhibit a first function of efficiently transporting the holes from the anode 3 to the light-emitting layer 6. Accordingly, a light-emitting efficiency of the light-emitting element 1 can be enhanced.

In particular, in the light-emitting element 1, since the laminate (the organic layer O) including the hole injection layer 4 and the hole transport layer 5 contains a hole-transporting material as described below and comes in contact with both the anode 3 and the light-emitting layer 6, even though electrons infiltrate (are injected) into the hole transport layer 5 from the light-emitting layer 6, the electrons can be rapidly transported and passed to the anode 3 side by the hole injection layer 4 and the hole transport layer 5. Accordingly, a second function of preventing the electrons from staying in the hole injection layer 4 and the hole transport layer 5 is exhibited. As a result, the hole injection layer 4 and the hole transport layer 5 can be prevented from being deteriorated by the electrons. Therefore, the light-emitting element 1 can achieve a long lifetime even when being driven at a current of a high current density.

The substrate 2 supports the anode 3. Since the light-emitting element 1 of this embodiment has a configuration in which light is emitted from the substrate 2 side (bottom emission type), the substrate 2 and the anode 3 are substantially transparent (transparent and colorless, transparent and colored, or translucent).

Examples of the constituent material of the substrate 2 include resin materials such as polyethylene terephthalate, polyethylene naphthalate, polypropylene, cycloolefin polymers, polyamides, polyethersulfones, polymethylmethacrylate, polycarbonates, and polyarylates; and glass materials such as quartz glass and soda glass. These materials may be used singly or in combinations of two or more materials.

The average thickness of the substrate 2 is not particularly limited, but is preferably in the range of about 0.1 to 30 mm, and more preferably, in the range of about 0.1 to 10 mm.

In the case where the light-emitting element 1 has a configuration in which light is emitted from the side opposite to the substrate 2 (top-emission type), either a transparent substrate or an opaque substrate may be used as the substrate 2.

Examples of the opaque substrate include a substrate made of a ceramic material such as alumina, one produced by forming an oxide film (insulating film) on the surface of a metal substrate such as a stainless steel substrate, and a substrate made of a resin material.

In the light-emitting element 1, the distance between the anode 3 and the cathode 9 (i.e., the average thickness of the laminate 14) is preferably in the range of 150 to 300 nm, more preferably 150 to 250 nm, and even more preferably 160 to 200 nm. Accordingly, a reduction in the driving voltage of the light-emitting element 1 can be achieved simply and reliably.

Components constituting the light-emitting element 1 will now be sequentially described in detail.

Anode

The anode 3 is an electrode that injects holes into the light-emitting layer 6 through the hole injection layer 4 and the hole transport layer 5 constituting the organic layer O described below. As the constituent material of the anode 3, a material having a large work function and excellent conductivity is preferably used.

Examples of the constituent material of the anode 3 include oxides such as ITO (Indium Tin Oxide), IZO (Indium Zinc Oxide), $In_2O_3$, $SnO_2$, Sb-containing $SnO_2$, and Al-containing ZnO; and metals such as Au, Pt, Ag, and Cu, and alloys containing these metals. These materials may be used singly or in combinations of two or more materials.

In particular, the anode 3 is preferably made of ITO. ITO is a material having transparency, a large work function, and excellent conductivity. Accordingly, holes can be efficiently injected into the hole injection layer 4 from the anode 3.

The surface of the anode 3 on the hole injection layer 4 side (the upper surface in FIG. 1) in the organic layer O is preferably subjected to a plasma treatment. Accordingly, chemical and mechanical stability of joining surfaces of the anode 3 and the hole injection layer 4 can be increased. As a result, a property of injecting holes into the hole injection layer 4 from the anode 3 can be enhanced. In addition, the plasma treatment will be described in detail along with a method of manufacturing the light-emitting element 1 described below.

The average thickness of the anode 3 is not particularly limited, but is preferably in the range of about 10 to 200 nm, and more preferably in the range of about 50 to 150 nm.

Cathode

The cathode 9 is an electrode that injects electrons into the electron transport layer 7 through the electron injection layer 8 described below. As the constituent material of the cathode 9, a material having a small work function is preferably used.

Examples of the constituent material of the cathode 9 include Li, Mg, Ca, Sr, La, Ce, Er, Eu, Sc, Y, Yb, Ag, Cu, Al, Cs, Rb, and alloys containing these materials. These materials may be used singly or in combinations of two or more materials (for example, as a laminate including a plurality of layers or as mixed layers of a plurality of kinds).

In particular, in the case where an alloy is used as the constituent material of the cathode 9, an alloy containing a stable metal element such as Ag, Al, or Cu, specifically, an alloy such as MgAg, AlLi, or CuLi is preferably used. By using such an alloy as the constituent material of the cathode 9, electron injection efficiency and stability of the cathode 9 can be enhanced.

The average thickness of the cathode 9 is not particularly limited, but is preferably in the range of about 100 to 10,000 nm, and more preferably, in the range of about 100 to 500 nm.

The light-emitting element 1 of this embodiment is of a bottom emission type, and thus the cathode 9 does not particularly require optical transparency.

Hole Injection Layer

The hole injection layer 4 has a function of enhancing an efficiency in injecting holes from the anode 3 (that is, has a hole-injecting property). In addition, as described below in detail, the hole injection layer 4 also has a function of transporting electrons.

The hole injection layer 4 contains a material having a hole-injecting property (that is, a hole-injecting material) and a material having an electron-transporting property (that is, an electron-transporting material). The electron-transporting material contained in the hole injection layer 4 will be described later along with an electron-transporting material contained in the hole transport layer 5.

Although the hole-injecting material contained in the hole injection layer 4 is not particularly limited, examples thereof include copper phthalocyanine, 4,4',4"-tris(N,N-phenyl-3-methylphenylamino)triphenylamine (m-MTDATA), and N,N'-bis-(4-diphenylamino-phenyl)-N,N'-diphenylbiphenyl-4-4'-diamine expressed by Formula. 1 as follows.

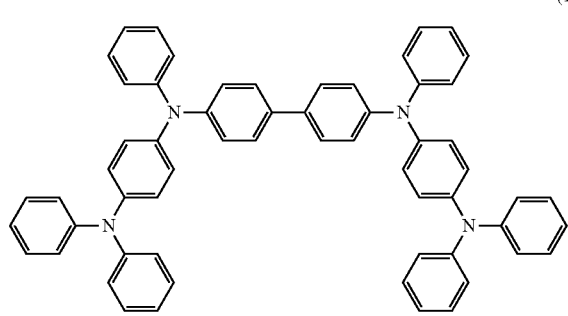

(1)

Particularly, as the hole-injecting material contained in the hole injection layer 4, in terms of excellent hole-injecting and hole-transporting properties, an amine-based material is preferably used, and diaminobenzene derivatives, benzidine derivatives (a material having a benzidine skeleton), triamine-based compounds having both a "diaminobenzene" unit and a "benzidine" unit, and tetraamine-based compounds are more preferably used.

The average thickness of the hole injection layer 4 is not particularly limited, but is preferably in the range of about 5 to 90 nm, and more preferably, in the range of about 10 to 70 nm.

Hole Transport Layer

The hole transport layer 5 has a function of transporting, to the light-emitting layer 6, holes injected from the anode 3 through the hole injection layer 4 (that is, has a hole-transporting property). In addition, as described below in detail, the hole transport layer 5 also has a function of transporting electrons.

The hole transport layer 5 contains a material having the hole-transporting property (that is, a hole-transporting material) and a material having the electron-transporting property (that is, an electron-transporting material). In addition, the electron-transporting material contained in the hole transport layer 5 will be described below in detail along with an electron-transporting material contained in the hole injection layer 4.

As the hole-transporting material contained in the hole transport layer 5, various types of p-type polymeric materials and various types of p-type low-molecular-weight materials may be used singly or in combinations thereof. Examples of the hole-transporting material include tetraarylbenzidine derivatives such as N,N'-di(1-naphthyl)-N,N'-diphenyl-1,1'-diphenyl-4,4'-diamine (NPD) expressed by Formula 2 or N,N'-diphenyl-N,N'-bis(3-methylphenyl)-1,1'-diphenyl-4, 4'-diamine (TPD), and tetraaryldiaminofluorene compounds or derivatives thereof (amine-based compounds). These materials may be used singly or in combinations of two or more materials.

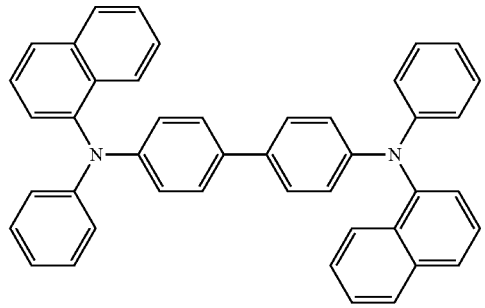

(2)

Particularly, as the hole-transporting material contained in the hole transport layer 5, in terms of excellent hole-injecting and hole-transporting properties, an amine-based material is preferably used, and benzidine derivatives (a material having a benzidine skeleton) are more preferably used.

In addition, as the hole-transporting material contained in the hole transport layer 5, one having a band gap (an energy difference between the HOMO level and the LUMO level) that can block electrons from the light-emitting layer 6 is preferably used. That is, it is preferable that the laminate including the hole injection layer 4 and the hole transport layer 5 have a function of blocking electrons.

Accordingly, the hole injection layer 4 and the hole transport layer 5 can block electrons from the light-emitting layer 6 by the first function while exhibiting the first function of transporting holes from the anode 3 to the light-emitting layer 6. Therefore, the holes and the electrons are efficiently confined in the light-emitting layer 6, thereby enhancing the light-emission efficiency.

Even though the hole transport layer 5 has the function of blocking electrons as such, there may be a case where during driving at a high-current density, the hole transport layer 5 cannot block all electrons and as a result, electrons infiltrate (are injected) into the hole transport layer 5. Even in this case, in the light-emitting element 1, since the hole injection layer 4 and the hole transport layer 5 contain the respective electron-transporting materials, the electrons that are not blocked by the hole transport layer 5 and infiltrate into the hole transport layer 5 can be rapidly transported and passed to the anode 3 side by the hole injection layer 4 and the hole transport layer 5.

The average thickness of the hole transport layer 5 is not particularly limited, but is preferably in the range of about 10 to 90 μm, and more preferably, in the range of about 30 to 70 nm.

Electron-Transporting Property of Hole Injection Layer and Hole Transport Layer

The electron-transporting material contained in the hole injection layer 4 and the hole transport layer 5 will be described in detail.

In the light-emitting element 1 of this embodiment, the laminate including the hole injection layer 4 and the hole transport layer 5 is provided between the anode 3 and the light-emitting layer 6 so as to come in contact with the two, and constitutes an organic layer O.

In addition, each of the hole injection layer 4 and the hole transport layer 5 contains the electron-transporting material.

That is, the organic layer O configured as the laminate including the hole injection layer 4 and the hole transport layer 5 contain the electron-transporting material having the electron-transporting property.

Accordingly, deterioration of the hole injection layer 4 and the hole transport layer 5 by the electrons can be prevented while providing good properties of injecting and transporting holes from the anode 3.

More specifically, in the light-emitting element 1, the laminate (the organic layer O) including the hole injection layer 4 and the hole transport layer 5 can efficiently transport holes from the anode 3 to the light-emitting layer 6. Therefore, the light-emission efficiency of the light-emitting element 1 can be enhanced.

In particular, in the light-emitting element 1, since the laminate including the hole injection layer 4 and the hole transport layer 5 contains the electron-transporting material and comes in contact with both the anode 3 and the light-emitting layer 6, even though electrons infiltrate (are injected) into the hole transport layer 5 from the light-emitting layer 6, the electrons can be rapidly transported and passed by the hole injection layer 4 and the hole transport layer 5 to the anode 3 side. Accordingly, the second function of preventing the electrons from staying in the hole injection layer 4 and the hole transport layer 5 is exhibited. As a result, the hole injection layer 4 and the hole transport layer 5 can be prevented from being deteriorated by the electrons. Therefore, the light-emitting element 1 can achieve a long lifetime even when being driven at a high current of a high density.

As described above, when electrons pass through the hole injection layer 4 or the hole transport layer 5, since the electron-transporting material has high resistance to electrons, the electron-transporting material in the hole injection layer 4 and the hole transport layer 5 is rarely deteriorated by the electrons. In addition, the electrons in the hole injection layer 4 and the hole transport layer 5 mainly flow and are transported along the electron-transporting material rather than the hole-transporting material or the hole-injecting material, so that the hole-transporting material in the hole injection layer 5 and the hole-injecting material in the hole transport layer 5 can be prevented from being deteriorated by the electrons.

The electron-transporting material contained in the hole injection layer 4 and the hole transport layer 5 is not particularly limited as long as the electron-transporting material is a material having the electron-transporting property and a well-known electron-transporting material may be used. Examples of the electron-transporting material include acene-based materials, quinoline derivatives such as organometallic complexes having 8-quinolinol or a derivative thereof as a ligand, e.g., tris(8-quinolinolato)aluminum ($Alq_3$), azaindolizine derivatives, oxadiazole derivatives, perylene derivatives, pyridine derivatives, pyrimidine derivatives, quinoxaline derivatives, diphenylquinone derivatives, and nitro-substituted fluorene derivatives. These materials may be used singly or in combinations of two or more materials.

Particularly, it is preferable that the electron-transporting material contained in the hole injection layer 4 and the hole transport layer 5 be an acene-based material.

Acene-based materials have an excellent electron-transporting property and also have a hole-transporting property. Therefore, the hole injection layer 4 or the hole transport layer 5 containing the acene-based material can rapidly transport electrons from the light-emitting layer 6 to the anode 3. In addition, the acene-based material has excellent resistance to electrons and holes. Therefore, deterioration of the hole injection layer 4 or the hole transport layer 5 by the electrons or the holes can be prevented or suppressed.

The acene-based material is not particularly limited as long as the material has an acene skeleton and exhibits the above-described effects. Examples of the acene-based material include naphthalene derivatives, anthracene derivatives, naphthacene derivatives (tetracene derivatives), pentacene derivatives, hexacene derivatives, and heptacene derivatives. These materials may be used singly or in combinations of two or more materials. Here, anthracene derivatives and naphthacene derivatives are preferably used, and anthracene derivatives (particularly having monoanthracene or bisanthracene as a main skeleton) are more preferably used.

Anthracene derivatives have an excellent electron-transporting property and films of anthracene derivatives can be simply formed by a vapor-phase deposition method. Therefore, by using an anthracene derivative as the acene-based material, a homogeneous hole injection layer 4 or a hole transport layer 5 can be easily formed while maintaining the excellent electron-transporting property of the hole injection layer 4 or the hole transport layer 5.

In addition, it is preferable that the hole injection layer 4 and the hole transport layer 5 respectively contain amine-based materials. The amine-based material has an excellent hole-transporting property. Therefore, the laminate (the organic layer O) including the hole injection layer 4 and the hole transport layer 5 containing the amine-based materials can rapidly transport electrons from the anode 3 to the light-emitting layer 6.

In this case, it is preferable that the hole injection layer 4 and the hole transport layer 5 be made of a mixed material in which the acene-based material and the amine-based material are mixed with each other. Accordingly, the balance between the hole-transporting property and the electron-transporting property in the laminate (the organic layer O) including the hole injection layer 4 and the hole transport layer 5 can be relatively simply adjusted in an appropriate range.

It is preferable that hydrocarbon compounds (dielectric materials) entirely made of carbon atoms and hydrogen atoms be used as the electron-transporting material contained in the hole injection layer 4 and the hole transport layer 5. Such compounds have a relatively low permittivity and a relatively low dielectric loss tangent and an excellent dielectric property. In addition, since the compounds do not have polar groups such as hydroxyl groups and carboxyl groups, the compounds have insufficient reactivity, are chemically relatively stable, and have low interactions with the hole-injecting material or the hole-transporting material. In these aspects, the characteristics of the light-emitting element 1 can be maintained in an excellent state for a long time.

The electron-transporting material contained in the hole injection layer 4 may be the same as or different from that contained in the hole transport layer 5.

In addition, it is preferable that the glass-transition temperature (Tg) of the electron-transporting material of the hole injection layer 4 and the hole transport layer 5 be as high as possible. Specifically, the glass-transition temperature thereof is preferably equal to or higher than 120° C. and more preferably equal to or higher than 150° C. Accordingly, even when the light-emitting element 1 is driven at a high current of a high current density and thus enters a high temperature state, performance degradation of the light-emitting element 1 by heat can be prevented.

The content of the electron-transporting material in the hole injection layer 4 and in the hole transport layer 5 is preferably equal to or higher than 30 wt % and equal to or lower than 70 wt %, more preferably equal to or higher than 40 wt % and equal to or lower than 60 wt %, and even more preferably equal to or higher than 50 wt % and equal to or lower than 60 wt %. Accordingly, the balance between the electron-transporting property and the hole-transporting of the laminate (the organic layer O) including the hole injection layer 4 and the hole transport layer 5 can be enhanced to be appropriate. In addition, in the case where the organic layer O has an electron-blocking property, the balance between the electron-blocking property and the electron-transporting property of the organic layer O can be enhanced to be appropriate.

For this, if the content is lower than the lower limit, the electron-transporting material in the hole injection layer 4 and the hole transport layer 5 is more likely to be excited, and the electron-transporting material itself emits light, resulting in an adverse effect on the light emission spectrum of the entire light-emitting element 1. On the other hand, if the content exceeds the upper limit, the thickness of all the layers constituting the light-emitting element 1 is excessively increased, so that the driving voltage of the light-emitting element 1 has a tendency to increase.

The content of the electron-transporting material in the hole injection layer 4 may be equal to or different from that in the hole transport layer 5.

The average thickness (the total thickness of the hole injection layer 4 and the hole transport layer 5) of the laminate (the organic layer O) including the hole injection layer 4 and the hole transport layer 5 is preferably equal to or greater than 20 nm and equal to or smaller than 100 nm, more preferably equal to or greater than 30 nm and equal to or smaller than 80 nm, and even more preferably equal to or greater than 30 nm and equal to or smaller than 70 nm. Accordingly, deterioration of the hole injection layer 4 and the hole transport layer 5 by electrons can be prevented while suppressing the driving voltage. In addition, an optical gap which enables proper emission of light from the light-emitting element 1 can be easily formed.

For this, if the average thickness is lower than the lower limit, the hole-injecting property of the hole injection layer 4 or the hole-transporting property of the hole transport layer 5 has a tendency to decrease depending on the thickness or constituent material of the hole injection layer 4 or the hole transport layer 5. On the other hand, if the average thickness exceeds the upper limit, formation of the optical gap becomes difficult, and the driving voltage of the light-emitting element 1 has a tendency to increase.

Light-Emitting Layer

The light-emitting layer 6 emits light as current flows between the anode 3 and the cathode 9 described above.

The light-emitting layer 6 contains a light-emitting material.

The light-emitting material is not particularly limited, and various types of fluorescent materials and phosphorescent materials may be used singly or in combinations of two or more materials.

Fluorescent materials that emit red fluorescence are not particularly limited. Examples of the fluorescent material include perylene derivatives such as tetraaryldiindenoperylene derivatives expressed by Formula 3 as follows, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo[ij]quinolizin-9-yl)ethenyl)-4H-pyran-4H-ylidene)propanedinitrile (DCJTB), and 4-(dicyanomethylene)-2-methyl-6-(p-dimethylaminostyryl)-4H-pyran (DCM).

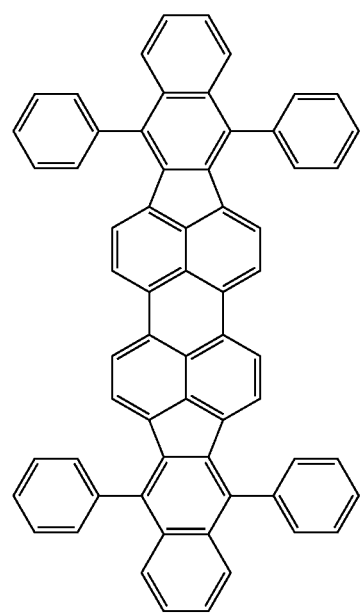

(3)

Red phosphorescent materials that emit red are not particularly limited. Examples of the red phosphorescent material include complexes of a metal such as iridium, ruthenium, platinum, osmium, rhenium, or palladium. Examples thereof further include compounds in which at least one ligand of the above-mentioned metal complexes has a phenylpyridine skeleton, a bipyridyl skeleton, a porphyrin skeleton, or the like. More specifically, examples thereof include tris(1-phenylisoquinoline)iridium, bis[2-(2'-benzo[4,5-α]thienyl)pyridinate-N,$C^{3'}$]iridium(acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,$C^{3'}$]iridium, and bis(2-phenylpyridine)iridium(acetylacetonate).

Blue fluorescent materials that emit blue fluorescence are not particularly limited. Examples of the blue fluorescent material include distyrylamine derivatives such as a distyrylamine-based compound expressed by Formula 4 as follows, monostyrylamine derivatives, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}phenylene-1,4-diyl)], and poly[(9,9-dioctylfluorene-2,7-diyl)-co-(ethynylbenzene)]. These materials may be used singly or in combinations of two or more materials.

(4)

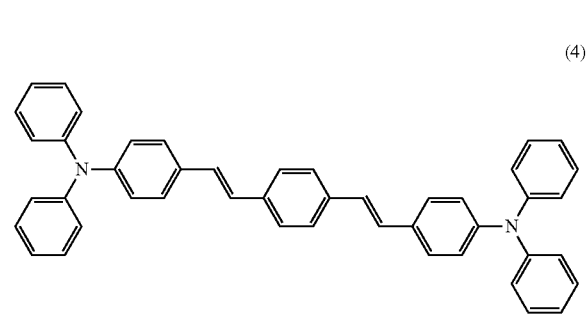 [SMILES: C(=C\c1ccc(N(c2ccccc2)c2ccccc2)cc1)/c1ccc(/C=C/c2ccc(N(c3ccccc3)c3ccccc3)cc2)cc1]

Blue phosphorescent materials that emit blue phosphorescence are not particularly limited. Examples of the blue phosphorescent material include complexes of a metal such as iridium, ruthenium, platinum, osmium, rhenium, or palladium. More specifically, examples thereof include bis[4,6-difluorophenylpyridinate-N,C$^{2'}$]-picolinate-iridium, tris[2-(2,4-difluorophenyl)pyridinate-N,C$^{2'}$]iridium, bis[2-(3,5-trifluoromethyl)pyridinate-N,C$^{2'}$]-picolinate-iridium, and bis(4,6-difluorophenylpyridinate-N,C$^{2'}$)iridium(acetylacetonate).

Green fluorescent materials that emit green fluorescence are not particularly limited. Examples of the green fluorescent material include coumarin derivatives, quinacridone and derivatives thereof such as a quinacridone derivative expressed by Formula 5 as follows, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-(2-methoxy-5-(2-ethoxyhexyloxy)-1,4-phenylene)]. These materials may be used singly or in combinations of two or more materials.

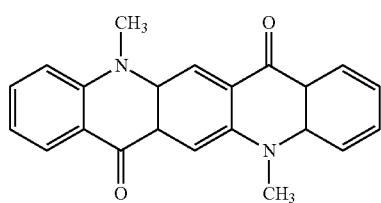

(5)

Green phosphorescent materials that emit green phosphorescence are not particularly limited. Examples of the green phosphorescent material include complexes of a metal such as iridium, ruthenium, platinum, osmium, rhenium, or palladium. Particularly, compounds in which at least one ligand of the above metal complexes has a phenylpyridine skeleton, a bipyridyl skeleton, a porphyrin skeleton, or the like are preferable. More specifically, examples thereof include fac-tris(2-phenylpyridine)iridium (Ir(ppy)$_3$), bis(2-phenylpyridinate-N,C$^{2'}$)iridium(acetylacetonate), and fac-tris[5-fluoro-2-(5-trifluoromethyl-2-pyridine)phenyl-C,N]iridium.

Examples of a fluorescent material that emits yellow fluorescence include compounds which have a naphthacene skeleton such as a rubrene-based material and in which an arbitrary number (preferably 2 to 6) of aryl groups are substituted at arbitrary positions in naphthacene, and mono-indenoperylene derivatives.

The light-emitting materials (the fluorescent materials or the phosphorescent materials) may be used singly or in combinations of two or more materials. In the case where two or more light-emitting materials are combined for use, the light-emitting layer 6 may have a form of a laminate in which a plurality of layers (light-emitting layers) having different light-emitting materials contained is laminated, or a form of a layer made of a mixed material in which a plurality of kinds of light-emitting materials is mixed. In the case where the light-emitting layer 6 is configured of a plurality of light-emitting layers, a layer (interlayer) which does not contribute to light emission may be interposed between the light-emitting layers.

As the constituent material of the light-emitting layer 6, a host material can be used in combination with the above-mentioned light-emitting material which is added (carried) as a guest material (dopant). The host material has a function of recombining holes and electrons to generate an exciton, transferring energy of the exciton to the light-emitting material (Förster transfer or Dexter transfer), and exciting the light-emitting material. When such a host material is used, for example, a light-emitting, material functioning as a guest material may be doped into the host material as a dopant.

The host material is not particularly limited as long as the host material has the above-described function for the light-emitting material used. When the light-emitting material contains a fluorescent material, examples of the host material include distyrylarylene derivatives, a compound expressed by Formula 6 as follows, naphthacene derivatives such as a compound expressed by Formula 7 as follows, anthracene derivatives such as 2-t-butyl-9,10-di(2-naphthyl)anthracene (TBADN), perylene derivatives, distyrylbenzene derivatives, distyrylamine derivatives, quinolinolato metal complexes such as tris(8-quinolinolato)aluminum complex (Alq$_3$), triarylamine derivatives such as triphenylamine tetramer, oxadiazole derivatives, rubrene such as a compound expressed by Formula 8 as follows and derivatives thereof, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi). These materials may be used singly or in combinations of two or more materials.

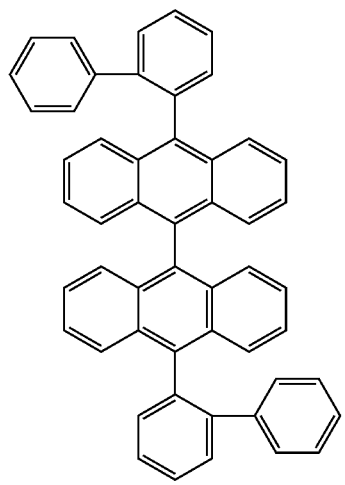

(6)

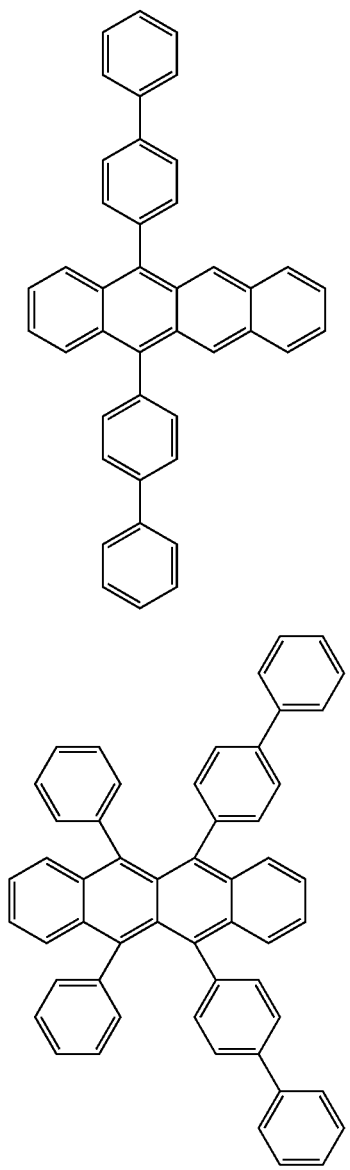

(7)

(8)

When the light-emitting material contains a phosphorescent material, examples of a first host material include carbazole derivatives such as 3-phenyl-4-(1'-naphthyl)-5-phenyl-carbazole and 4,4'-N,N'-dicarbazolebiphenyl (CBP). These materials may be used singly or in combinations of two or more materials.

When the light-emitting layer 6 contains a host material, the content (the doping amount) of the light-emitting material in the light-emitting layer 6 is preferably in the range of 0.01 to 20 wt %, and more preferably in the range of 0.1 to 10 wt %. By causing the content of the light-emitting material to be in such a range, the light-emission efficiency can be optimized.

The average thickness of the light-emitting layer 6 is not particularly limited, but is preferably in the range of about 1 to 60 nm and more preferably in the range of about 3 to 50 nm.

Electron Transport Layer

The electron transport layer 7 has a function of transporting electrons injected from the cathode 9 through the electron injection layer 8 to the light-emitting layer 6.

Examples of the constituent material (electron-transporting material) of the electron transport layer 7 include quinoline derivatives such as organometallic complexes having 8-quinolinol or a derivative thereof as a ligand, e.g., tris(8-quinolinolato)aluminum ($Alq_3$) expressed by Formula 9 as follows, azaindolizine derivatives such as a compound expressed by Formula 10 as follows, oxadiazole derivatives, perylene derivatives, pyridine derivatives, pyrimidine derivatives, quinoxaline derivatives, diphenylquinone derivatives, and nitro-substituted fluorene derivatives. These materials may be used singly or in combinations of two or more materials.

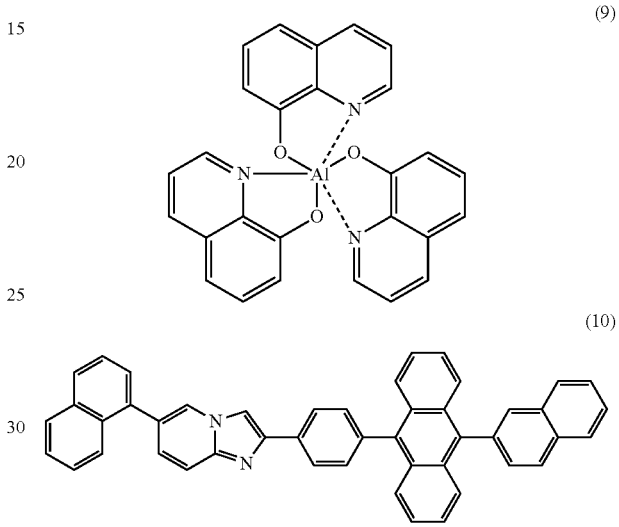

(9)

(10)

In addition, when two or more electron-transporting materials as described above are combined for use, the electron transport layer 7 may be made of a mixed material in which the two or more electron-transporting materials are mixed, or be configured by laminating a plurality of layers made of different electron-transporting materials.

When the electron transport layer 7 is configured by laminating the plurality of layers made of different electron-transporting materials, as the constituent material of the layer on the anode side (a first electron transport layer), any material that can inject electrons into the light-emitting layer 6 may be used. Examples of the material include anthracene derivatives, and quinoline derivatives such as organometallic complexes having 8-quinolinol or a derivative thereof as a ligand, e.g., tris(8-quinolinolato)aluminum ($Alq_3$). As the constituent material of the layer on the cathode side (a second electron transport layer), any material that can receive electrons from the electron injection layer 8 and inject the electrons to the first electron transport layer may be used. Examples of the material preferably include azaindolizine derivatives such as a compound expressed by Formula 10 as above, pyridine derivatives, and phenanthrene derivatives.

The average thickness of the first electron transport layer is preferably smaller than that of the second electron transport layer, and is more preferably equal to or greater than 0.1 times and equal to or smaller than 0.4 times that of the second electron transport layer. Accordingly, excellent electron-transporting and electron-injecting properties of the electron transport layer 7 can be achieved.

The average thickness of the electron transport layer 7 is not particularly limited, but is preferably in the range of about 0.5 to 100 nm, and more preferably, in the range of about 1 to 50 nm.

Electron Injection Layer

The electron injection layer 8 has a function of enhancing the efficiency in injecting electrons from the cathode 9.

Examples of the constituent material (electron-injecting material) of the electron injection layer 8 include various types of inorganic insulating materials and inorganic semiconductor materials.

Examples of the inorganic insulating material include alkali metal chalcogenides (oxides, sulfides, selenides, and tellurides), alkaline earth metal chalcogenides, alkali metal halides, and alkaline earth metal halides. These materials may be used singly or in combinations of two or more materials. By using these materials as a main material of the electron injection layer 8, an electron-injecting property can be further enhanced. In particular, alkali metal compounds (such as alkali metal chalcogenides and alkali metal halides) have a very small work function. By configuring the electron injection layer 8 using this, the light-emitting element 1 can achieve a high luminance.

Examples of the alkali metal chalcogenides include $Li_2O$, LiO, $Na_2S$, $Na_2Se$, and NaO.

Examples of alkaline earth metal chalcogenide include CaO, BaO, SrO, BeO, BaS, MgO, and CaSe.

Examples of the alkali metal halide include CsF, LIF, NaF, KF, LiCl, KCl, and NaCl.

Examples of the alkaline earth metal halide include $CaF_2$, $BaF_2$, $SrF_2$, $MgF_2$, and $BeF_2$.

Examples of the inorganic semiconductor material include oxides, nitrides, and oxynitrides containing at least one element selected from Li, Na, Ba, Ca, Sr, Yb, Al, Ga, In, Cd, Mg, Si, Ta, Sb, and Zn. These materials may be used singly or in combinations of two or more materials.

The average thickness of the electron injection layer 8 is not particularly limited, but is preferably in the range of about 0.1 to 500 nm, more preferably in the range of about 0.2 to 100 nm, and even more preferably in the range of 0.2 to 10 nm.

Sealing Member

The sealing member 10 is provided to cover the anode 3, the laminate 14, and the cathode 9, and has a function of airtightly sealing these components to block oxygen and moisture. The formation of the sealing member 10 provides advantages of an enhancement in reliability of the light-emitting element 1, prevention of a change in quality and degradation (enhancement in durability), and the like.

Examples of the constituent material of the sealing member 10 include Al, Au, Cr, Nb, Ta, Ti, alloys containing these, silicon oxides, and various types of resin materials. When a conductive material is used as the constituent material of the sealing member 10, an insulating film is preferably provided between the sealing member 10 and each of the anode 3, the laminate 14, and the cathode 9, as needed, in order to prevent a short circuit.

Alternatively, the sealing member 10 may be formed in a flat plate facing the substrate 2 so that areas between the sealing member 10 and the substrate 2 are sealed with a sealing material such as a thermosetting resin.

In the light-emitting element 1 configured as described above, the laminate (the organic layer O) including the hole injection layer 4 and the hole transport layer 5 can efficiently transport holes from the anode 3 to the light-emitting layer 6. Accordingly, the light-emitting efficiency of the light-emitting element 1 can be enhanced.

In particular, in the light-emitting element 1, since the laminate including the hole injection layer 4 and the hole transport layer 5 contains the electron-transporting material and comes in contact with both the anode 3 and the light-emitting layer 6, even though electrons infiltrate (are injected) into the hole transport layer 5 from the light-emitting layer 6, the electrons can be rapidly transported and passed to the anode 3 side by the hole injection layer 4 and the hole transport layer 5. Accordingly, the electrons are prevented from staying in the hole injection layer 4 and the hole transport layer 5. As a result, the hole injection layer 4 and the hole transport layer 5 can be prevented from being deteriorated by the electrons. Therefore, the light-emitting element 1 can achieve a long lifetime even when being driven at a current of a high current density.

The light-emitting element 1 described above can be produced, for example, as follows.

[1] First, a substrate 2 is prepared, and an anode 3 is formed on the substrate 2.

The anode 3 can be formed by, for example, a dry plating method such as a chemical vapor deposition (CVD) method, e.g., plasma CVD or thermal CVD, or vacuum deposition; a wet plating method such as electroplating; a sputtering method; a spraying method; a sol-gel method; a metal organic deposition (MOD) method; or joining of a metal foil.

[2] Next, a hole injection layer 4 is formed on the anode 3.

The hole injection layer 4 can be formed by, for example, a vapor-phase process using a dry plating method such as a CVD method, vacuum deposition, or sputtering.

Alternatively, the hole injection layer 4 can also be formed by, for example, supplying a material for forming a hole injection layer made by dissolving a hole-injecting material in a solvent or dispersing a hole-injecting material in a dispersion medium onto the anode 3, and then performing drying (removing the solvent or removing the dispersion medium).

As the method of supplying the material for forming a hole injection layer, various types of application methods such as a spin coating method, a roll coating method, or an ink jet printing method can be used. The hole injection layer 4 can be relatively easily formed by using such an application method.

Examples of the solvent or the dispersion medium used for preparing the material for forming a hole injection layer include various types of inorganic solvents, organic solvents, and mixed solvents containing these solvents.

The drying can be performed by, for example, leaving the resulting substrate 2 to stand under atmospheric pressure or a reduced pressure, performing a heating treatment, or blowing an inert gas.

Furthermore, prior to this process, an oxygen plasma treatment may be performed on the upper surface of the anode 3. Accordingly, lyophilicity can be provided on the upper surface of the anode 3, organic substances adhered to the upper surface of the anode 3 can be removed (cleaned), and the work function near the upper surface of the anode 3 can be adjusted.

Regarding conditions for this oxygen plasma treatment, for example, it is preferable that the plasma power be in the range of about 100 to 800 W, the oxygen gas flow rate be in the range of about 50 to 100 mL/min., the transferring speed of the member to be treated (the anode 3) be in the range of about 0.5 to 10 mm/sec, and the temperature of the substrate 2 be in the range of about 70° C. to 90° C.

[3] Next, a hole transport layer 5 is formed on the hole injection layer 4.

The hole transport layer 5 can be formed by, for example, a vapor-phase process using a dry plating method such as a CVD method, vacuum deposition, or sputtering.

Alternatively, the hole transport layer 5 can also be formed by supplying a material for forming a hole transport layer made by dissolving a hole-transporting material in a solvent or dispersing a hole-transporting material in a dispersion medium onto the hole injection layer 4, and then performing drying (removing the solvent or removing the dispersion medium).

[4] Next, a light-emitting layer 6 is formed on the hole transport layer 5.

The light-emitting layer 6 can be formed by, for example, a vapor-phase process using a dry plating method such as vacuum deposition.

[5] Next, an electron transport layer 7 is formed on the light-emitting layer 6.

The electron transport layer 7 can be formed by, for example, a vapor-phase process using a dry plating method such as vacuum deposition.

Alternatively, the electron transport layer 7 can also be formed by supplying a material for forming an electron transport layer made by dissolving an electron-transporting material in a solvent or dispersing an electron-transporting material in a dispersion medium onto the light-emitting layer 6, and then performing drying (removing the solvent or removing the dispersion medium).

[6] An electron injection layer 8 is formed on the electron transport layer 7.

When an inorganic material is used as the constituent material of the electron injection layer 8, the electron injection layer 8 can be formed by, for example, a vapor-phase process using a dry plating method such as a CVD method, vacuum deposition, or sputtering; or applying an inorganic fine particle ink and performing baking.

[7] Next, a cathode 9 is formed on the electron injection layer 8.

The cathode 9 can be formed by, for example, a vacuum deposition method, a sputtering method, joining of a metal foil, or applying a metal fine particle ink and performing baking.

The light-emitting element 1 is obtained by the above-described processes.

Finally, the obtained light-emitting element 1 is covered with a sealing member 10, and the sealing member 10 is joined to the substrate 2.

Second Embodiment

Hereinafter, a light-emitting element according to a second embodiment of the invention will be described mainly on the basis of differences from the first embodiment, and description of the same facts will be omitted.

Figure 2:
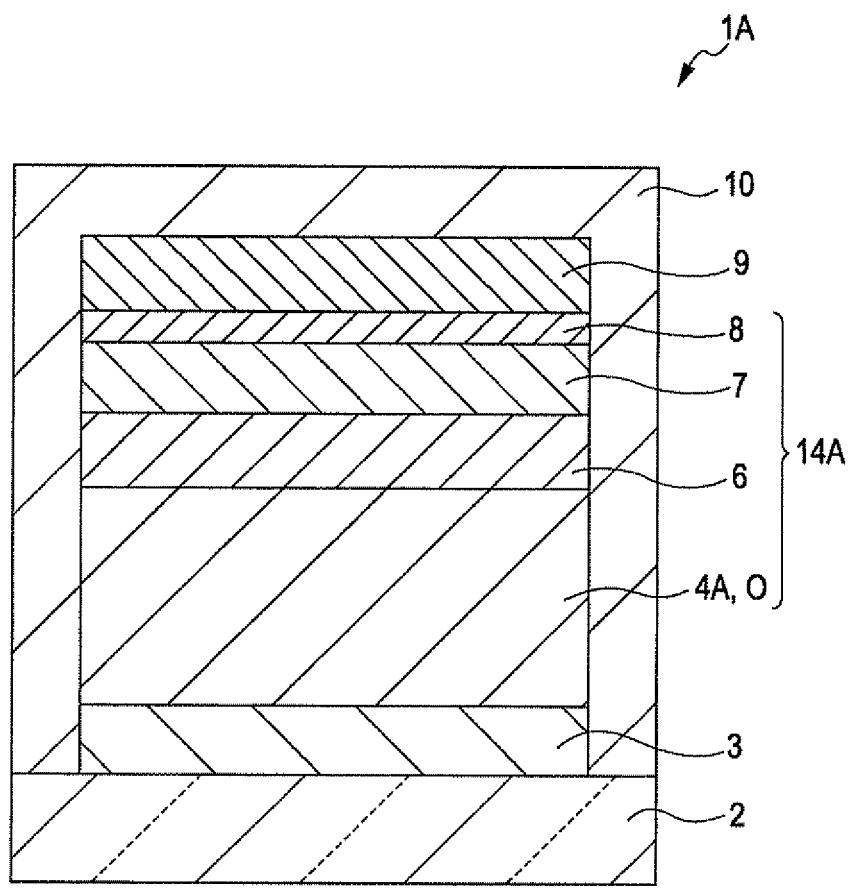
FIG. 2 is a cross-sectional view schematically showing a light-emitting element according to a second embodiment of the invention.

FIG. 2 is across-sectional view schematically showing the light-emitting element according to the second embodiment of the invention. In the following description, for the convenience of description, the upper side in FIG. 2, that is, the cathode 9 side represents "up", and the lower side in FIG. 2, that is, the anode 3 side represents "down".

A light-emitting element 1A according to this embodiment is the same as the light-emitting element 1 of the above-described first embodiment except that a hole transport layer is omitted.

In the light-emitting element 1A, a laminate 14A is interposed between an anode 3 and a cathode 9. In the laminate 14A, from the anode 3 side to the cathode 9 side, a hole injection layer 4A, a light-emitting layer 6, an electron transport layer 7, and an electron injection layer 8 are laminated in this order.

The hole injection layer 4A is provided between the anode 3 and the light-emitting layer 6 so as to come in contact with both layers. In this embodiment, an organic layer O is constituted by the hole injection layer 4A.

The hole injection layer 4A contains a hole-injecting material and an electron-transporting material like the hole injection layer 4 in the light-emitting element 1 of the above-described first embodiment. Accordingly, the first function of transporting holes and the second function of preventing the electrons infiltrating from the light-emitting layer 6 from staying in the hole injection layer 4A (the organic layer O) are exhibited.

Accordingly, deterioration of the hole injection layer 4A by electrons can be prevented while providing a good property of injecting holes from the anode 3.

In addition, only the hole injection layer 4A is present between the anode 3 and the light-emitting layer 6, so that the number of layers constituting the light-emitting element 1A can be reduced. As a result, driving the light-emitting element 1A by a low voltage can be achieved.

As the constituent material of the hole injection layer 4A, the same material as the constituent material of the hole injection layer 4 in the light-emitting element 1 of the above-described first embodiment may be used.

In particular, as the hole-injecting material contained in the hole injection layer 4A, an amine-based material is preferably used, and a benzidine derivative is more preferably used.

Benzidine derivatives have excellent hole-injecting and hole-transporting properties. Therefore, in the hole injection layer 4A made of the benzidine derivative as a main material, holes can be efficiently injected from the anode 3, and the injected holes can be efficiently transported to the light-emitting layer 6. Consequently, the light-emitting layer 1A can achieve a high light-emission efficiency.

In addition, since the benzidine derivative has excellent hole-injecting and hole-transporting properties as described above, the hole injection layer 4A can be increased in thickness. Therefore, in a manufacturing process of the light-emitting element 1A, even though foreign substances are present on the anode 3 when the hole injection layer 4A is formed on the anode 3, the hole injection layer 4A can be formed to cover (bury) the foreign substances. As the hole injection layer 4A is increased in thickness as such, the foreign substances can be prevented or suppressed from spreading between the layers constituting the light-emitting element 1A. As a result, a short circuit that may be caused between the layers constituting the light-emitting element 1A by the foreign substances can be prevented. Accordingly, a yield in manufacturing the light-emitting element 1A can be enhanced.

The average thickness of the hole injection layer 4A (the organic layer O) is preferably equal to or greater than 20 nm and equal to or smaller than 100 nm, more preferably equal to or greater than 30 nm and equal to or smaller than 80 nm, and even more preferably equal to or greater than 30 nm and equal to or smaller than 70 nm. Accordingly, deterioration of the hole injection layer 4A by electrons can be prevented while suppressing a driving voltage. In addition, an optical gap which enables proper emission of light from the light-emitting element 1A can be easily formed.

According to the light-emitting element 1A of the second embodiment, the same effects as those of the light-emitting element 1 of the above-described first embodiment can be exhibited.

Third Embodiment

Hereinafter, a light-emitting element according to a third embodiment of the invention will be described mainly on the basis of differences from the first and second embodiments, and description of the same facts will be omitted.

Figure 3:
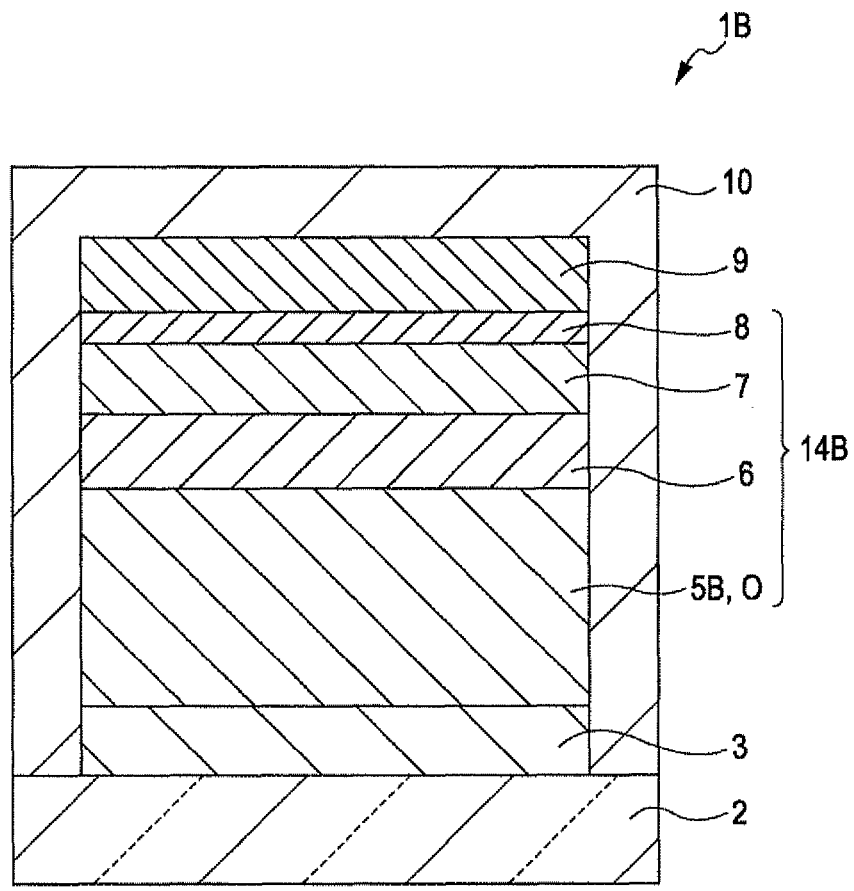
FIG. 3 is a cross-sectional view schematically showing a light-emitting element according to a third embodiment of the invention.

FIG. 3 is a cross-sectional view schematically showing a light-emitting element according to a third embodiment of the invention. In the following description, for the convenience of description, the upper side in FIG. 3, that is, the cathode 9 side represents "up", and the lower side in FIG. 3, that is, the anode 3 side represents "down".

A light-emitting element 1B according to this embodiment is the same as the light-emitting element 1 of the above-described first embodiment except that a hole injection layer is omitted. In addition, the light-emitting element 1B of this embodiment is the same as the light-emitting element 1A of the above-described second embodiment except that a hole transport layer is provided instead of the hole injection layer.

In the light-emitting element 1B, a laminate 14B is interposed between an anode 3 and a cathode 9. In the laminate 14B, from the anode 3 side to the cathode 9 side, a hole transport layer 5B, a light-emitting layer 6, an electron transport layer 7, and an electron injection layer 8 are laminated in this order.

The hole transport layer 5B is provided between the anode 3 and the light-emitting layer 6 so as to come in contact with both layers. In this embodiment, an organic layer O is constituted by the hole transport layer 5B.

The hole transport layer 5B contains a hole-transporting material and an electron-transporting material like the hole transport layer 5 in the light-emitting element 1 of the above-described first embodiment. Accordingly, the first function of transporting holes and the second function of preventing the electrons infiltrating from the light-emitting layer 6 from staying in the hole transport layer 5B (the organic layer O) are exhibited.

Accordingly, deterioration of the hole transport layer 5B by electrons can be prevented while providing a good property of transporting holes from the anode 3.

In addition, only the hole transport layer 5B is present between the anode 3 and the light-emitting layer 6, so that the number of layers constituting the light-emitting element 18 can be reduced. As a result, driving the light-emitting element 18 by a low voltage can be achieved.

As the constituent material of the hole transport layer 5B, the same material as the constituent material of the hole transport layer 5 in the light-emitting element 1 of the above-described first embodiment may be used.

In particular, as the hole-transporting material contained in the hole transport layer 5B, an amine-based material is preferably used, and a benzidine derivative is more preferably used.

The benzidine derivative has excellent hole-injecting and hole-transporting properties. Therefore, in the hole transport layer 5B made of the benzidine derivative as a main material, holes can be efficiently injected from the anode 3, and the injected holes can be efficiently transported to the light-emitting layer 6. Consequently, the light-emitting layer 1B can achieve a high light-emission efficiency.

In addition, since the benzidine derivative has excellent hole-injecting and hole-transporting properties as described above, the hole transport layer 5B can be increased in thickness. Therefore, in a manufacturing process of the light-emitting element 1B, even though foreign substances are present on the anode 3 when the hole transport layer 5B is formed on the anode 3, the hole transport layer 5B can be formed to cover (bury) the foreign substances. As the hole transport layer 5B is increased in thickness as such, the foreign substances can be prevented or suppressed from spreading between the layers constituting the light-emitting element 1B. As a result, a short circuit that may be caused between the layers constituting the light-emitting element 1B by the foreign substances can be prevented. Accordingly, a yield in manufacturing the light-emitting element 1B can be enhanced.

The average thickness of the hole transport layer 5B (the organic layer O) is preferably equal to or greater than 20 nm and equal to or smaller than 100 nm, more preferably equal to or greater than 30 nm and equal to or smaller than 80 nm, and even more preferably equal to or greater than 30 nm and equal to or smaller than 70 nm. Accordingly, deterioration of the hole transport layer 5B by electrons can be prevented while suppressing a driving voltage. In addition, an optical gap which enables proper emission of light from the light-emitting element 1B can be easily formed.

According to the light-emitting element 1B of the third embodiment, the same effects as those of the light-emitting element 1 of the above-described first embodiment can be exhibited.

Fourth Embodiment

Hereinafter, a light-emitting element according to a fourth embodiment of the invention will be described mainly on the basis of differences from the first embodiment, and description of the same facts will be omitted.

Figure 4:
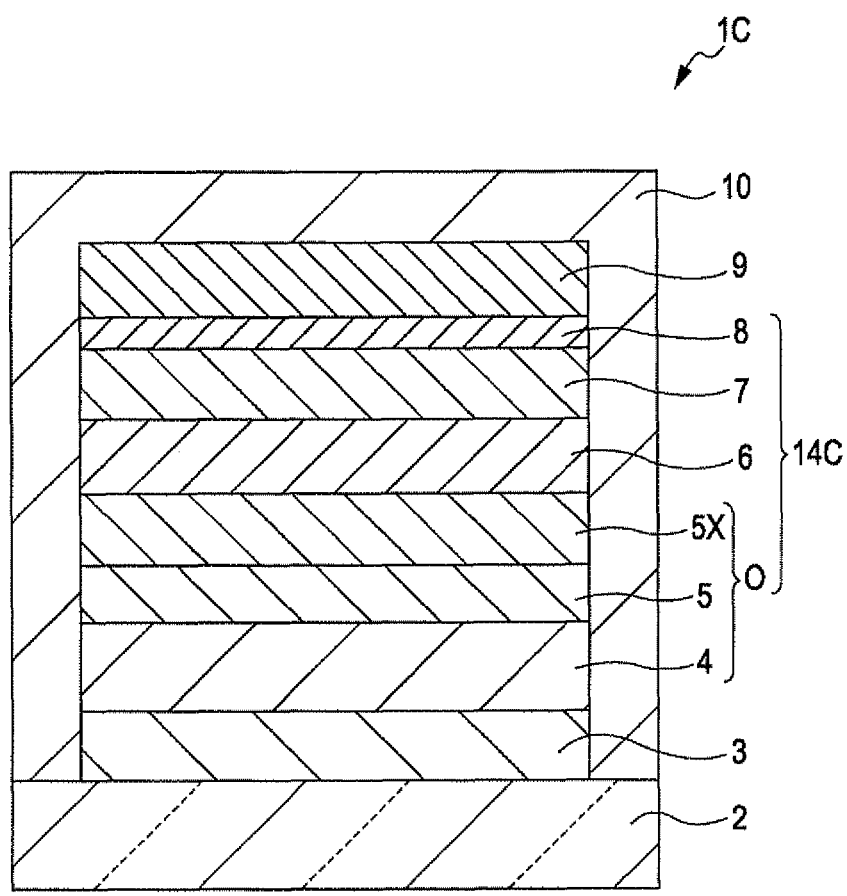
FIG. 4 is a cross-sectional view schematically showing a light-emitting element according to a fourth embodiment of the invention.

FIG. 4 is a cross-sectional view schematically showing the light-emitting element according to the fourth embodiment of the invention. In the following description, for the convenience of description, the upper side in FIG. 4, that is, the cathode 9 side represents "up", and the lower side, that is, the anode 3 side represents "down".

A light-emitting element (electroluminescence element) 1C shown in FIG. 4 is configured so that an anode 3, a hole injection layer 4, a hole transport layer 5, an electron neutralization layer (electron trapping layer) 5X, a light-emitting layer 6, an electron transport layer 7, an electron injection layer 8, and a cathode 9 are laminated in this order. That is, in the light-emitting element 1C, between the anode 3 and the cathode 9, a laminate 14C in which the hole injection layer 4, the hole transport layer 5, the electron neutralization layer 5X, the light-emitting layer 6, the electron transport layer 7, and the electron injection layer 8 are laminated in this order from the anode 3 side to the cathode 9 side is interposed.

In this embodiment, an organic layer O is constituted by the hole injection layer 4, the hole transport layer 5, the electron neutralization layer 5X.

In the light-emitting element 1C, besides the hole injection layer 4 and the hole transport layer 5, the electron neutralization layer 5X contains a hole-transporting material and thus has a hole-transporting property as described later in detail, so that the organic layer O can exhibit the first function of efficiently transporting holes to the light-emitting layer 6. In addition, electrons from the light-emitting layer 6 can be blocked by the first function (particularly, the first function of the electron neutralization layer 5X). Therefore, the holes and the electrons can be efficiently confined in the light-emitting layer 6. As a result, the light-emission efficiency of the light-emitting element 1C can be enhanced.

In particular, in the light-emitting element 1C, since the electron neutralization layer 5X contains an electron-trapping material, even though the electron neutralization layer 5X cannot block all the electrons, the electron neutralization layer 5X can neutralize (extinguish) the electrons from the light light-emitting layer 6. Accordingly, the second function of preventing the electrons from staying in the organic layer O (the electron neutralization layer 5X) can be exhibited. Therefore, the organic layer O (for example, the hole injection layer 4 and the hole transport layer 5) provided on the anode 3 side with respect to the electron neutralization layer 5X can be prevented from being deteriorated by the electrons. Therefore, the light-emitting element 1 can achieve a long lifetime even when being driven at a current of a high current density.

In this embodiment, the hole injection layer 4 has a function of enhancing an efficiency in injecting holes from the anode 3 (that is, has a hole-injecting property).

As the hole injection layer 4 is provided between the anode 3 and the hole transport layer 5 described later, the property of transporting holes from the anode 3 is enhanced. As a result, the light-emission efficiency of the light-emitting element 1C can be enhanced.

The hole injection layer 4 of this embodiment does not contain the electron-transporting material as described in the first embodiment but contains the hole-injecting material.

In addition, the hole injection layer 4 may be omitted depending on the constituent materials of the anode 3 and the hole transport layer 5.

In addition, the hole transport layer 5 has a function of transporting the holes injected from the anode 3 through the hole injection layer 4 to the electron neutralization layer 5X (that is, has a hole-transporting property).

Since the hole transport layer 5 is provided between the anode 3 and the electron neutralization layer 5X described later, the holes from the anode 3 can be efficiently transported to the electron neutralization layer 5X. As a result, the light-emission efficiency of the light-emitting element 1C can be enhanced.

The hole transport layer 5 of this embodiment does not contain the electron-transporting material as described in the first embodiment but contains the hole-transporting material.

Here, as the hole-injecting material, the hole-injecting material employed in the first embodiment may be used, and as the hole-transporting material, besides the hole-transporting material employed in the first embodiment, a compound expressed by Formula 11 may be used.

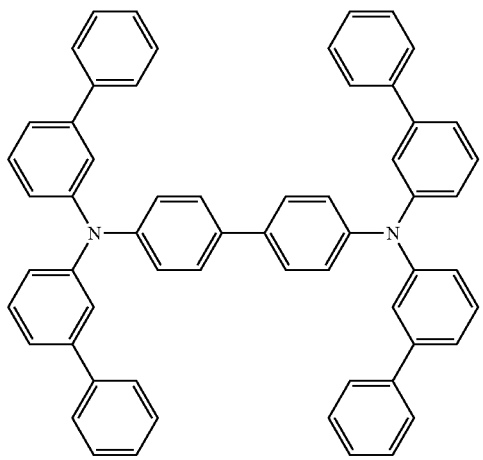

(11)

In this embodiment, the average thickness of the hole transport layer 5 is not particularly limited, but is preferably in the range of about 5 to 90 nm and more preferably in the range of about 10 to 70 nm.

The electron neutralization layer 5X is provided in contact with both the hole transport layer 5 and the light-emitting layer 6.

The electron neutralization layer 5X has a function of transporting holes from the hole transport layer 5 to the light-emitting layer 6. In addition, the electron neutralization layer 5X has a function of trapping electrons from the light-emitting layer 6 (that is, an electron-trapping property).

The electron neutralization layer 5X contains a hole-transporting material having the hole-transporting property and an electron-trapping material having the electron-trapping property.

Since the electron neutralization layer 5X contains the hole-transporting material, the electron neutralization layer 5X can efficiently transport the holes to the light-emitting layer 6 and block the electrons from the light-emitting layer 6. Therefore, the holes and electrons can be efficiently confined in the light-emitting layer 6. As a result, the light-emission efficiency of the light-emitting element 1C can be enhanced.

In particular, since the electron neutralization layer 5X contains the electron-trapping material, even though all the electrons from the light-emitting layer 6 cannot be blocked and the electrons infiltrate (are injected) into the electron neutralization layer 5X, the electron neutralization layer 5X can neutralize (extinguish) the electrons. Accordingly, the second function of preventing the electrons from staying in the organic layer O (the electron neutralization layer 5X) can be exhibited. Therefore, the hole injection layer 4 or the hole transport layer 5 provided on the anode 3 side with respect to the electron neutralization layer 5X can be prevented from being deteriorated by the electrons. Therefore, the light-emitting element 1C can achieve a long lifetime even when being driven at a current of a high current density.

As the hole-transporting material contained in the electron neutralization layer 5X, the above-described hole-transporting material contained in the hole transport layer 5 or the like may be used. That is, as the hole-transporting material contained in the electron neutralization layer 5X, various types of p-type polymeric materials and various types of p-type low-molecular-weight materials may be used singly or in combinations thereof. Examples of the hole-transporting material include tetraarylbenzidine derivatives such as N,N'-di(1-naphthyl)-N,N'-diphenyl-1,1'-diphenyl-4,4'-diamine (NPD) expressed by Formula 11 as above or N,N'-diphenyl-N,N'-bis(3-methylphenyl)-1,1'-diphenyl-4,4'-diamine (TPD), and tetraaryldiaminofluorene compounds or derivatives thereof (amine-based compounds). These materials may be used singly or in combinations of two or more materials.

Particularly, as the hole-transporting material contained in the electron neutralization layer 5X, in terms of excellent hole-injecting and hole-transporting properties, an amine-based material is preferably used, and benzidine derivatives (a material having a benzidine skeleton) are more preferably used.

The hole-transporting material contained in the electron neutralization layer 5X may be the same as or different from the hole-transporting material contained in the hole transport layer 5, but in terms of increasing the light-emission efficiency of the light-emitting element 1C, is preferably the same as the hole-transporting material contained in the hole transport layer 5.

In addition, as the hole-transporting material contained in the electron neutralization layer 5X, one having a band gap (an energy difference between the HOMO level and the LUMO level) that can block electrons from the light-emitting layer 6 is preferably used. That is, it is preferable that the electron neutralization layer 5X have a function of blocking electrons.

Accordingly, the electron neutralization layer 5X can block electrons from the light-emitting layer 6 while transporting holes to the light-emitting layer 6. Therefore, the holes and the electrons are efficiently confined in the light-emitting layer 6, thereby enhancing the light-emission efficiency.

Even though the electron neutralization layer 5X has the function of blocking electrons as such, there may be a case where during driving at a high-current density, the electron neutralization layer 5X cannot block all electrons and as a result, electrons infiltrate (are injected) into the electron neutralization layer 5X. Even in this case, in the light-emitting element 1C, since the electron neutralization layer 5X contains the electron-trapping material, the electrons that are not blocked by the electron neutralization layer 5X and infiltrate into the electron neutralization layer 5X can be neutralized (extinguished). Therefore, the electrons are prevented from reaching the hole transport layer 5 or the hole injection layer 4.

In addition, when the electron neutralization layer 5X is relatively thin, the electron neutralization layer 5X itself may not have the electron-blocking property. In this case, by configuring the layer adjacent to the anode 3 side with respect to the electron neutralization layer 5X (in this embodiment, the hole transport layer 5) to have the electron-blocking property, the electrons and the holes can be efficiently confined in the light-emitting layer 6.

In addition, the electron-trapping material contained in the electron neutralization layer 5X is a material that can accept the electrons (that is, is reduced to be stable).

More specifically, as the electron-trapping material contained in the electron neutralization layer 5X, for example, a material such as the host material or the guest material (light-emitting material) contained in the light-emitting layer 6 described later or the electron-transporting material contained in the electron transport layer 7 may be used. However, in terms of excellent resistance to electrons and holes and of having an appropriate electron-trapping property (the electron-trapping property is not too strong), the same material as the host material contained in the light-emitting layer 6 is preferably used.

Specifically, the electron-trapping material contained in the electron neutralization layer 5X is not particularly limited, and examples of the electron-trapping material include distyrylarylene derivatives, anthracene derivatives such as 9,10-di(2-naphthyl)anthracene, naphthacene derivatives such as 5,12-diphenylnaphthacene, perylene derivatives, distyrylbenzene derivatives, quinolinolato metal complexes such as tris(8-quinolinolato)aluminum complex ($Alq_3$), oxadiazole derivatives, rubrene and derivatives thereof, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBI). These materials may be used singly or in combinations of two or more materials.

Particularly, it is preferable that the electron-trapping material contained in the electron neutralization layer 5X be an acene-based material.

Acene-based materials have an appropriate electron-trapping property. Therefore, electrons are prevented from being unnecessarily consumed by the electron neutralization layer 5X, so that an increase in the driving voltage of the light-emitting element 1C due to the electron neutralization layer 5X can be suppressed. In addition, the acene-based material has excellent resistance to electrons and holes. Therefore, deterioration of the electron neutralization 5X by the electrons or the holes can be prevented, thereby achieving a long lifetime of the light-emitting element 1C. Moreover, the acene-based material itself is less likely to emit light, so that the electron neutralization layer 5X is prevented from having an adverse effect on the light emission spectrum of the light-emitting element 1C.

The acene-based material is not particularly limited as long as the material has an acene skeleton and exhibits the above-described effects. Examples of the acene-based material include naphthalene derivatives, anthracene derivatives, naphthacene derivatives (tetracene derivatives), pentacene derivatives, hexacene derivatives, and heptacene derivatives. These materials may be used singly or in combinations of two or more materials. Here, anthracene derivatives and naphthacene derivatives are preferably used, and anthracene derivatives (particularly having monoanthracene or bisanthracene as a main skeleton) are more preferably used.

The acene-based material (particularly, anthracene derivatives and naphthacene derivatives) has an appropriate electron-trapping property, and a film of the acene-based material can be formed relatively simply with high film quality by a vapor-phase deposition method.

In addition, when the electron neutralization layer 5X contains the acene-based material as the electron-trapping material, it is preferable that the electron neutralization layer 5X contain an amine-based material as the hole-transporting material. The amine-based material has an excellent hole-transporting property. Therefore, the electron neutralization layer 5X containing the amine-based materials can rapidly transport holes from the anode 3 to the light-emitting layer 6.

In this case, it is preferable that the electronic neutralization layer 5X be made of a mixed material in which the acene-based material and the amine-based material are mixed with each other. Accordingly, the balance between the hole-transporting property (the first function) and the electron-trapping property (the second function) in the electronic neutralization layer 5X can be relatively simply adjusted in an appropriate range.

In addition, it is preferable that hydrocarbon compounds (dielectric materials) entirely made of carbon atoms and hydrogen atoms be used as the electron-trapping material contained in the electronic neutralization layer 5X. Since the compounds do not have polar groups such as hydroxyl groups and carboxyl groups, the compounds have insufficient reactivity, are chemically relatively stable, have excellent resistance to carriers (electrons and holes), and have low interactions with the hole-transporting material. In these aspects, the characteristics of the light-emitting element 1C can be maintained in an excellent state for a long time.

In addition, it is preferable that the glass-transition temperature (Tg) of the electron-trapping material of the electronic neutralization layer 5X be as high as possible. Specifically, the glass-transition temperature thereof is preferably equal to or higher than 80° C. and more preferably equal to or higher than 100° C. Accordingly, even when the light-emitting element 1C is driven at a current of a high current density and thus enters a high temperature state, performance degradation of the light-emitting element 1C by heat can be prevented.

The content of the electron-trapping material in the electron neutralization layer 5X is preferably equal to or higher than 30 wt % and equal to or lower than 70 wt %, more preferably equal to or higher than 40 wt % and equal to or lower than 60 wt %, and even more preferably equal to or higher than 50 wt % and equal to or lower than 60 wt %. Accordingly, the electron-trapping property of the electron neutralization layer 5X can be enhanced to be appropriate while suppressing the driving voltage of the light-emitting element 1C.

For this, if the content is lower than the lower limit, depending on the thickness of the electron neutralization layer 5X, the kind of the electron-trapping material, and the like, the electron-trapping property of the electron neutralization layer 5X has a tendency to decrease. In addition, if the content is too low, the electron-trapping material in the electron neutralization layer 5X is more likely to be excited, and the electron-trapping material itself emits light, resulting in an adverse effect on the light emission spectrum of the entire light-emitting element 1C. On the other hand, if the content exceeds the upper limit, depending on the thickness of the electron neutralization layer 5X, the kind of the electron-trapping material, and the like, the electron-trapping property of the electron neutralization layer 5X is too strong and thus the driving voltage of the light-emitting element 1C has a tendency to increase.

The average thickness of the electron neutralization layer 5X is preferably equal to or greater than 20 nm and equal to or smaller than 60 nm, more preferably equal to or greater than 20 nm and equal to or smaller than 50 nm, and even more preferably equal to or greater than 30 nm and equal to or smaller than 50 nm. Accordingly, the electron-trapping property of the electron neutralization layer 5X can be enhanced to be appropriate while suppressing the driving voltage of the light-emitting element 1C. In addition, an optical gap which enables proper emission of light from the light-emitting element 1C can be easily formed.

For this, if the average thickness is lower than the lower limit, depending on the concentration or the constituent material of the electron-trapping material of the electron neutralization layer 5X, the electron-trapping property of the electron neutralization layer 5X has a tendency to decrease. On the other hand, if the average thickness exceeds the upper limit, formation of the optical gap becomes difficult, and the driving voltage of the light-emitting element 1 has a tendency to increase.

In addition, in consideration of emission of light from the light-emitting element 1C, the distance between the anode 3 and the light-emitting layer 6 (that is, the total thickness of the hole injection layer 4, the hole transport layer 5, and the electron neutralization layer 5X in this embodiment) is preferably equal to or smaller than 70 nm. Therefore, in this embodiment, the thickness of the electron neutralization layer 5X is set according to the thickness of the hole injection layer 4 or the hole transport layer 5 so that the distance between the anode 3 and the light-emitting layer 6 is in the above-described range.

The electron neutralization layer 5X is preferably formed on the hole transport layer 5 by, for example, a vapor-phase process using a dry plating method such as a CVD method, vacuum deposition, or sputtering.

Alternatively, the electron neutralization layer 5X may also be formed by supplying a material for forming an electron neutralization layer made by dissolving a hole-transporting material and an electron-trapping material in a solvent or dispersing a hole-transporting material and an electron-trapping material in a dispersion medium onto the hole transport layer 5, and then performing drying (removing the solvent or removing the dispersion medium) thereon.

According to the light-emitting element 1C configured as described above, since the electron neutralization layer 5X contains the hole-transporting material, the electron neutralization layer 5X can efficiently transport the holes to the light-emitting layer 6 and block the electrons from the light-emitting layer 6. Therefore, the holes and the electrons can be efficiently confined in the light-emitting layer 6. As a result, the light-emission efficiency of the light-emitting element 1C can be enhanced.

In particular, in the light-emitting element 1C, since the electron neutralization layer 5X contains the electron-trapping material, even though the electron neutralization layer 5X cannot block all the electrons, the electron neutralization layer 5X can neutralize (extinguish) the electrons from the light light-emitting layer 6. Accordingly, the second function of preventing the electrons from staying in the organic layer O (the electron neutralization layer 5X) can be exhibited. Therefore, the organic layer O (for example, the hole injection layer 4 and the hole transport layer 5) provided on the anode 3 side with respect to the electron neutralization layer 5X can be prevented from being deteriorated by the electrons. Therefore, the light-emitting element 1 can achieve a long lifetime even when being driven at a current of a high current density.

In addition, when the electron-trapping material contained in the electron neutralization layer 5X is an acene-based material, it is preferable that the light-emitting layer 6 use tetracene derivatives (naphthacene derivatives) as the host material and use diindenoperylene-based derivatives as the guest material. The light-emitting layer 6 containing the tetracene derivatives and diindenoperylene-based derivatives can efficiently perform emission of red light.

Fifth Embodiment

Hereinafter, a light-emitting element according to a fifth embodiment of the invention will be described mainly on the basis of differences from the fourth embodiment, and description of the same facts will be omitted.

Figure 5:
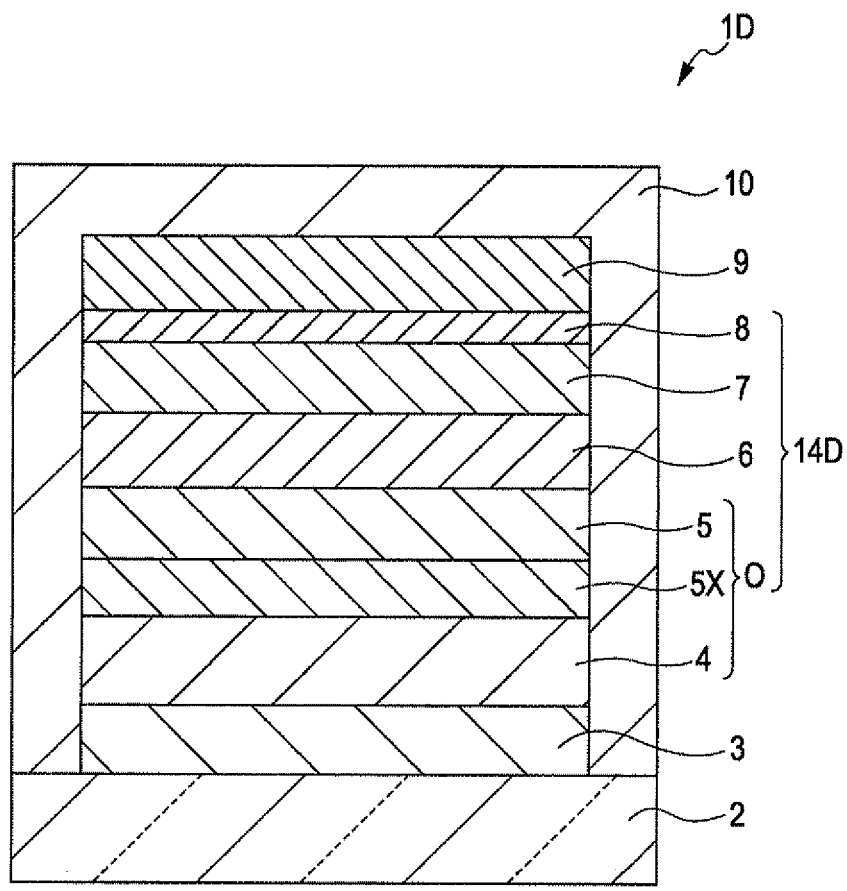
FIG. 5 is a cross-sectional view schematically showing a light-emitting element according to a fifth embodiment of the invention.

FIG. 5 is a cross-sectional view schematically showing the light-emitting element according to the fifth embodiment of the invention. In the following description, for the convenience of description, the upper side in FIG. 5, that is, the cathode 9 side represents "up", and the lower side, that is, the anode 3 side represents "down".

A light-emitting element (electroluminescence element) 1D shown in FIG. 5 is configured so that an anode 3, a hole injection layer 4, an electron neutralization layer (electron trapping layer) 5X, a hole transport layer 5, a light-emitting layer 6, an electron transport layer 7, an electron injection layer 8, and a cathode 9 are laminated in this order. That is, in the light-emitting element 1D, between the anode 3 and the cathode 9, a laminate 14D in which the hole injection layer 4, the electron neutralization layer 5X, the hole transport layer 5, the light-emitting layer 6, the electron transport layer 7, and the electron injection layer 8 are laminated in this order from the anode 3 side to the cathode 9 side is interposed.

In this embodiment, an organic layer O is constituted by the hole injection layer 4, the electron neutralization layer 5X, and the hole transport layer 5, and this embodiment is the same as the fourth embodiment except for the position of the electron neutralization layer 5X.

In the light-emitting element 1D, besides the hole injection layer 4 and the hole transport layer 5, the electron neutralization layer 5X contains a hole-transporting material and thus has a hole-transporting property, so that the organic layer O can exhibit the first function of efficiently transporting holes to the light-emitting layer 6. In addition, electrons from the light-emitting layer 6 can be blocked by the first function (particularly, the first function of the hole transport layer 5). Therefore, the holes and the electrons can be efficiently confined in the light-emitting layer 6. As a result, the light-emission efficiency of the light-emitting element 1D can be enhanced.

In particular, in the light-emitting element 1D, since the electron neutralization layer 5X contains an electron-trapping material, even though the hole transport layer 5 cannot block all the electrons, the electron neutralization layer 5X can neutralize (extinguish) the electrons. Accordingly, the second function of preventing the electrons from staying in the organic layer O (the electron neutralization layer 5X) can be exhibited. Therefore, the hole injection layer 4 provided on the anode 3 side with respect to the electron neutralization layer 5X can be prevented from being deteriorated by the electrons.

In addition, since the electrons are prevented from staying in the hole transport layer 5, deterioration of the hole transport layer 5 by the electrons can be prevented. Therefore, the light-emitting element 1D can achieve a long lifetime even when being driven at a current of a high current density.

In particular, in this embodiment, the electron neutralization layer 5X is provided in contact with both the hole injection layer 4 and the hole transport layer 5, so that the electron neutralization layer 5X can achieve an excellent hole-transporting property. In addition, the electrons infiltrating into the hole transport layer 5 can be rapidly neutralized (extinguished) by the electron neutralization layer 5X.

According to the light-emitting element 1D configured as described above, since the electron neutralization layer 5X contains the hole-transporting material, the holes can be efficiently transported to hole transport layer 5. In addition, the hole transport layer 5 can efficiently transport the holes to the light-emitting layer 6 and block the electrons from the light-emitting layer 6. Therefore, the holes and electrons can be efficiently confined in the light-emitting layer 6. As a result, the light-emission efficiency of the light-emitting element 1D can be enhanced.

In particular, in the light-emitting element 1D, since the electron neutralization layer 5X contains the electron-trapping material, even though the hole transport layer 5 can block all the electrons, the electron neutralization layer 5X can neutralize (extinguish) the electrons. Accordingly, the hole injection layer 4 provided on the anode 3 side with respect to the electron neutralization layer 5X can be prevented from being deteriorated by the electrons. In addition, since the electrons are prevented from staying in the hole transport layer 5, deterioration of the hole transport layer 5 by the electrons can be prevented. Therefore, the light-emitting element 1D can achieve a long lifetime even when being driven at a current of a high current density.

In addition, as the electron-transporting material and the electron-trapping material described above, materials having high affinity to electrons (high electron affinity materials) may be generally used. When the organic layer O contains the material over the entirety as in the first to third embodiments, the material functions as the electron-transporting material that transports electrons. On the other hand, when the material is contained in a part in the thickness direction as in the fourth and fifth embodiments, the material functions as the electron-trapping material that traps the electrons. Therefore, the electron-transporting material and the electron-trapping material may use the same kind of or the same material and may exhibit different functions depending on the layer configuration of the organic layer O. However, even when the material exhibits any function, the material can prevent the electrons infiltrating from the light-emitting layer 6 from staying in the organic layer O.

The light-emitting elements 1, 1A, 1B, 1C, and 1D as described above can be used in light-emitting devices of, for example, light sources of exposure heads of printers, copiers, fax machines, and the like that employ electrophotography, light sources for sensors, light sources for illumination and pica projectors (handheld projectors), light sources for scanners, and light sources for frontlights of reflective liquid crystal display devices. Such light-emitting devices have the light-emitting elements with long lifetimes, resulting in excellent reliability.

By arranging a plurality of light-emitting elements in a matrix form, a display device (a display device of the invention) can be configured. Such a display device can display images with high quality for a long time and have excellent reliability.

The method of driving the display device is not particularly limited, and may be either an active matrix method or a passive matrix method.

An electronic apparatus including the light-emitting element, the light-emitting device, or the display device of the invention has excellent reliability.

Next, an example of the display device to which the display device of the invention is applied will be described.

Figure 6:
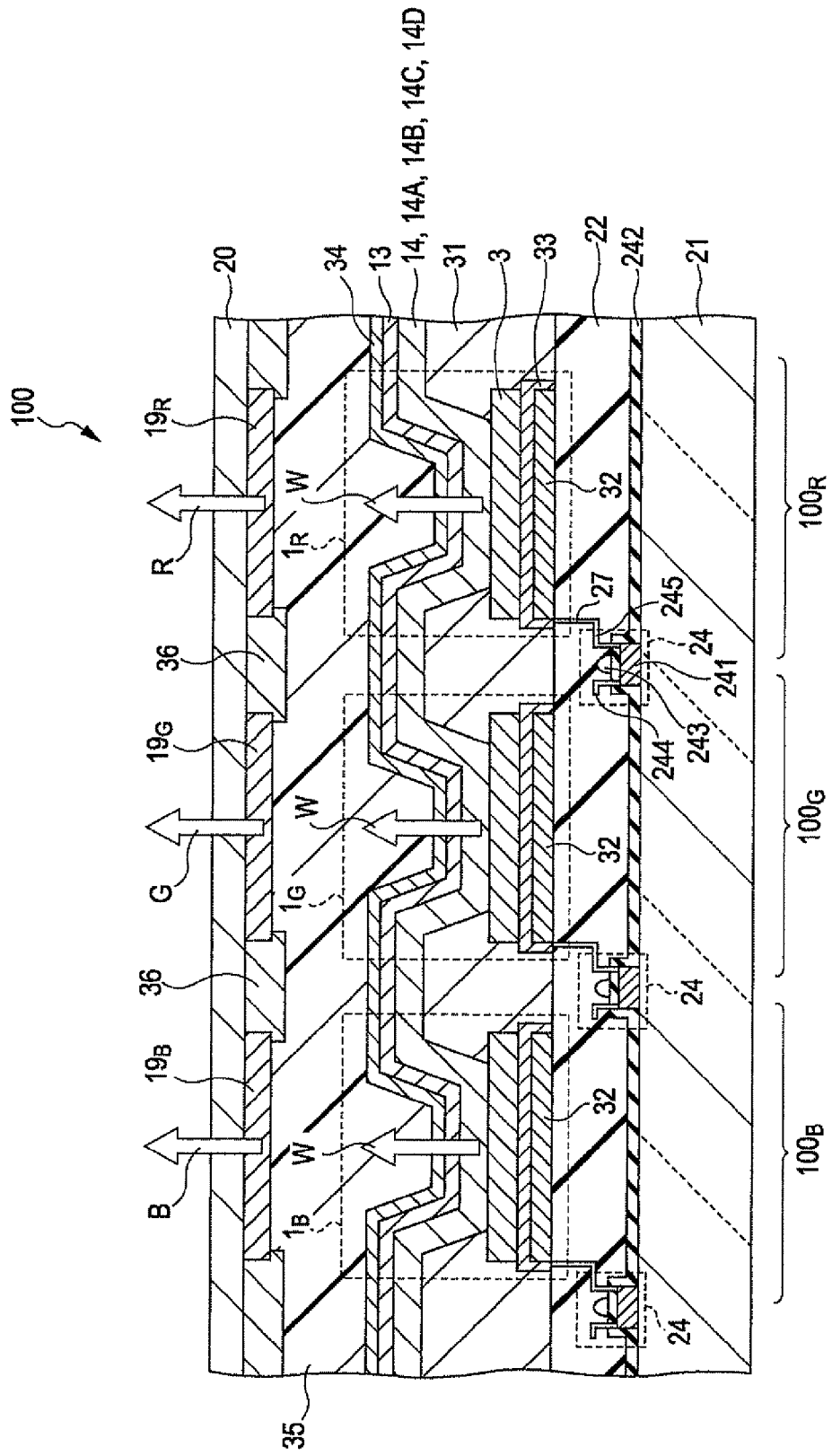
FIG. 6 is a longitudinal cross-sectional view showing an embodiment of a display device to which a display device of the invention is applied.

FIG. 6 is a longitudinal cross-sectional view showing an embodiment of the display device to which the display device of the invention is applied.

A display device 100 shown in FIG. 6 includes a substrate 21, a plurality of light-emitting elements $1_R$, $1_G$, and $1_B$ and color filters $19_R$, $19_G$, and $19_B$ provided so as to correspond to subpixels $100_R$, $100_G$, and $100_B$, respectively, and a plurality of driving transistors 24 for driving the light-emitting elements $1_R$, $1_G$, and $1_B$. The display device 100 is a display panel having a top-emission structure.

The driving transistors 24 are provided on the substrate 21. A planarization layer 22 made of an insulating material is provided to cover the driving transistors 24.

Each of the driving transistors 24 includes a semiconductor layer 241 made of silicon, a gate insulating layer 242 provided on the semiconductor layer 241, a gate electrode 243 provided on the gate insulating layer 242, a source electrode 244, and a drain electrode 245.

The light-emitting elements $1_R$, $1_G$, and $1_B$ are provided on the planarization layer to correspond to the respective driving transistors 24.

In the light-emitting element $1_R$, a reflective film 32, a corrosion-preventing film 33, an anode 3, a laminate (organic EL light-emitting portion) 14, a cathode 13, and a cathode cover 34 are laminated on the planarization, layer 22 in this order. In this embodiment, the anode 3 of each of the light-emitting elements $1_R$, $1_G$, and $1_B$ constitutes a pixel electrode and is electrically connected to the corresponding drain electrode 245 of the driving transistor 24 via an electric conduction portion (wiring) 27. The cathode 13 of each of the light-emitting elements $1_R$, $1_G$, and $1_B$ constitutes a common electrode.

In FIG. 6, the light-emitting element $1_R$ emits white light. For example, a light-emitting layer of the light-emitting element $1_R$ is configured of a laminate in which a light-emitting layer that emits red light, a light-emitting layer that emits blue light, and a light-emitting layer that emits green light are laminated, or a laminate in which a light-emitting layer that emits blue light and a light-emitting layer that emits yellow light are laminated.

The configurations of the light-emitting elements $1_G$ and $1_B$ are the same as that of the light-emitting element $1_R$. In FIG. 6, like configurations the same as those of FIGS. 1 to 5 are denoted by like reference numerals. The configurations (characteristics) of the reflective films 32 of the light-emitting elements $1_R$, $1_G$, and $1_B$ may be different from each other depending on the wavelength of light.

A partition wall 31 is provided between the adjacent light-emitting elements $1_R$, $1_G$, and $1_B$. An epoxy layer 35 made of an epoxy resin is provided on the light-emitting elements $1_R$, $1_G$, and $1_B$ so as to cover them.

The color filters $19_R$, $19_G$, and $19_B$ are provided on the above-mentioned epoxy layer 35 so as to correspond to the light-emitting elements $1_R$, $1_G$, and $1_B$.

The color filters $19_R$ convert white light W emitted from the light-emitting element $1_R$ to red light. The color filters $19_G$ convert white light W emitted from the light-emitting element $1_G$ to green light. The color filters $19_B$ convert white light W emitted from the light-emitting element $1_B$ to blue light. By using the color filters $19_R$, $19_G$, and $19_B$ in combination with the light-emitting elements $1_R$, $1_G$, and $1_B$, a full-color image can be displayed.

A light-shielding layer 36 is provided between the adjacent color filters $19_R$, $19_G$, and $19_B$. This configuration can prevent unintended subpixels $100_S$, $100_G$, and $100_B$ from emitting light.

A sealing substrate 20 is provided on the color filters $19_R$, $19_G$, and $19_B$ and the light-shielding layer 36 so as to cover them.

The display device 100 described above may have a configuration that displays monochromatic images and can also display full-color images by selecting the light-emitting materials used for the respective light-emitting elements $1_R$, $1_G$, and $1_B$.

The display device 100 (the display device of the invention) can be incorporated in various types of electronic apparatuses.

Figure 7:
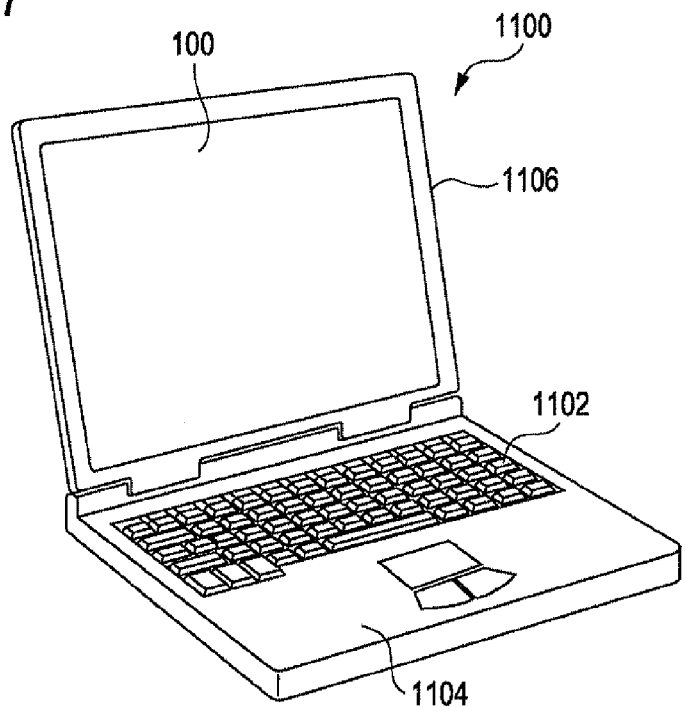
FIG. 7 is a perspective view showing the configuration of a mobile (or notebook) personal computer to which an electronic apparatus of the invention is applied.

FIG. 7 is a perspective view showing the configuration of a mobile (or notebook) personal computer to which an electronic apparatus of the invention is applied.

In FIG. 5, a personal computer 1100 includes a body portion 1104 including a keyboard 1102 and a display unit 1106 including a display portion. The display unit 1106 is supported so as to be rotationally movable with respect to the body portion 1104 with a hinge structure portion therebetween.

In this personal computer 1100, the display portion of the display unit 1106 is configured of the display device 100 described above.

Figure 8:
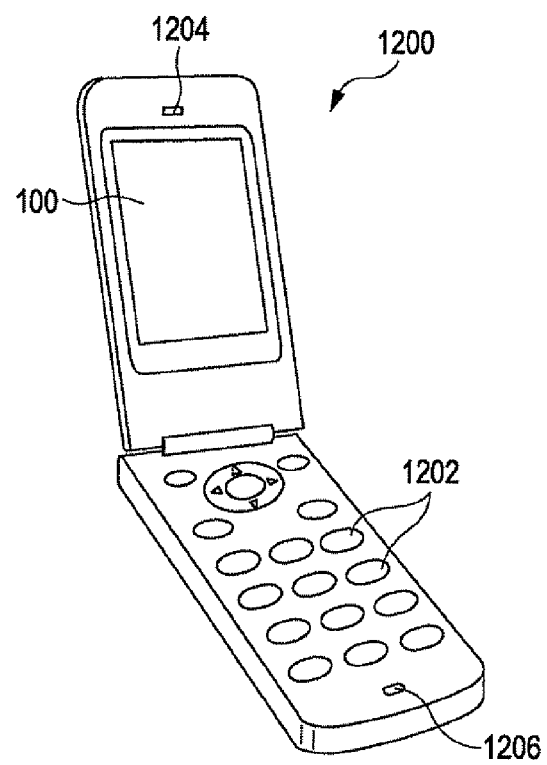
FIG. 8 is a perspective view showing the configuration of a portable phone (including a PHS) to which the electronic apparatus of the invention is applied.

FIG. 8 is a perspective view showing the configuration of a portable phone (including a PHS) to which the electronic apparatus of the invention is applied.

In FIG. 8, a portable phone 1200 includes a plurality of operation buttons 1202, an earpiece 1204, a mouthpiece 1206, and a display portion.

In the portable phone 1200, the display portion is configured of the display device 100 described above.

FIG. 9 is a perspective view showing the configuration of a digital still camera to which the electronic apparatus of the invention is applied. Connections with external devices are also simply shown in this figure.

In a typical film camera, a silver-salt photographic film is exposed to an optical image of an object, whereas, in a digital still camera 1300, an optical image of an object is photoelectrically converted by an imaging device such as a CCD (Charge Coupled Device) to generate imaging signals (image signals).

A display portion is provided on the rear surface of a case (body) 1302 of the digital still camera 1300, and is configured to perforin displaying on the basis of imaging signals obtained by the CCD. The display portion functions as a finder that displays an object as an electronic image.

In the digital still camera 1300, this display portion is configured of the display device 100 described above.

A circuit board 1308 is provided inside the case. This circuit board 1308 has a memory installed to store (memorize) the imaging signals.

Moreover, a light-receiving unit 1304 including an optical lens (imaging optical system), the CCD, and the like is provided on the front side (on the rear side in the configuration shown in the figure) of the case 1302.

When a user confirms an image of an object displayed on the display portion and pushes a shutter button 1306, imaging signals of the CCD at that time are transferred to and stored in the memory of the circuit board 1308.

In addition, in the digital still camera 1300, video signal output terminals 1312 and an input and output terminal 1314 for data communication are provided on a side surface of the case 1302. As shown in FIG. 8, a television monitor 1430 is connected to the video signal output terminals 1312, and a personal computer 1440 is connected to the input and output terminal 1314 for data communication as needed. Furthermore, the imaging signals stored in the memory of the circuit board 1308 are output to the television monitor 1430 or the personal computer 1440 by a predetermined operation.

In addition to the personal computer (mobile personal computer) shown in FIG. 7, the portable phone shown in FIG. 8, and the digital still camera shown in FIG. 9, examples of applications of the electronic apparatus of the invention include a television, a video camera, viewfinder-type and direct-monitoring-type video tape recorders, a laptop personal computer, a car navigation system, a pager, an electronic notebook (including one having a communication function), an electronic dictionary, an electronic calculator, an electronic videogame device, a word processor, a workstation, a video telephone, a security television monitor, electronic binoculars, a POS terminal, and devices with a touch panel (e.g., a cash dispenser in a financial institution and an automated ticket vending machine), medical instruments (e.g., an electronic thermometer, a blood pressure gauge, a blood sugar meter, an electrocardiogram display device, an ultrasonic diagnostic device, and a display device for an endoscope), a fish finder, various types of measuring apparatuses and measuring gauges (e.g., measuring gauges of vehicles, airplanes, and ships), a flight simulator, various types of monitors, and a projection display device such as a projector.

While the light-emitting element, the light-emitting device, the display device, and the electronic apparatus according to the invention have been described based on the embodiments shown in the figures, the invention is not limited to the embodiments.

For example, in the above-described fourth embodiment, the configuration in which the hole injection layer and the hole transport layer are interposed between the anode and the electron neutralization layer is described. However, between the anode and the hole injection layer, between the hole injection layer and the hole transport layer, and between the hole transport layer and the electron neutralization layer, at least one different layer (for example, a layer that adjusts properties of injecting or transporting electrons or holes) may be interposed.

In addition, for example, in the fifth embodiment described above, between the anode and the hole injection layer, between the hole injection layer and the electron neutralization layer, and between the electron neutralization layer and the hole transport layer, and between the hole transport layer and the light-emitting layer, at least one different layer (for example, a layer that adjusts properties of injecting or transporting electrons or holes) may be interposed.

EXAMPLES

Next, Examples of the invention will be described.
1. Production of Light-Emitting Elements

Example 1A

<1A> First, a transparent glass substrate having an average thickness of 0.5 mm was prepared. Next, an ITO electrode (anode) having an average thickness of 150 nm was formed on the substrate by a sputtering method.

The substrate was immersed in acetone and 2-propanol in this order to perform ultrasonic cleaning, and then subjected to an oxygen plasma treatment and an argon plasma treatment. The plasma treatments were performed by a plasma power of 100 W, at a gas flow rate of 20 sccm, for a treatment time of 5 sec in a state where the substrate was warmed to 70 to 90° C.

<2A> Next, the benzidine derivative (hole-injecting material) expressed by Formula 1 and an anthracene derivative (electron-transporting material) expressed by Formula 12 were co-deposited on the ITO electrode by a vacuum deposition method, thereby forming a hole injection layer having an average thickness of 20 nm.

Here, the hole injection layer was made of a material in which the benzidine derivative (hole-transporting material) expressed by Formula 1 and the anthracene derivative (electron-transporting material) expressed by Formula 12 were mixed with each other. The mixing ratio (ratio by weight) was (benzidine derivative):(anthracene derivative)=90:10.

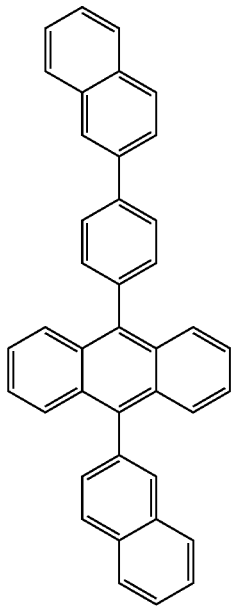

(12)

<3A> Next, the benzidine derivative (hole-transporting material) expressed by Formula 2 and the anthracene derivative (electron-transporting material) expressed by Formula 12 were co-deposited on the ITO electrode by a vacuum deposition method, thereby forming a hole transport layer having an average thickness of 50 nm.

Here, the hole transport layer was made of a material in which the benzidine derivative (hole-transporting material) expressed by Formula 2 and the anthracene derivative (electron-transporting material) expressed by Formula 12 were mixed with each other. The mixing ratio (ratio by weight) was (benzidine derivative):(anthracene derivative)=90:10.

<4A> Next, a constituent material of a red-light-emitting layer was deposited on the hole transport layer by a vacuum deposition method, thereby forming a red-light-emitting layer (light-emitting layer) having an average thickness of 40 nm. As the constituent material of the red-light-emitting layer, the tetraaryldiindenoperylene derivative expressed by Formula 3 was used as the red-light-emitting material (guest material), and the naphthacene derivative expressed by Formula 8 was used as a host material. In addition, the content (doping concentration) of the light-emitting material (dopant) in the red-light-emitting layer was 1.0 wt %.

<5A> Next, a film of tris(8-quinolinolato)aluminum ($Alq_3$) expressed by Formula 9 was formed on the red-light-emitting layer by a vacuum deposition method, thereby forming a first electron transport layer having an average thickness of 5 nm.

<6A> Next, a film of the azaindolizine derivative expressed by Formula 10 was formed on the first electron transport layer by a vacuum deposition method, thereby forming a second electron transport layer having an average thickness of 25 nm.

Accordingly, an electron transport layer in which the first and second electron transport layers are laminated was obtained.

<7A> Next, a film of lithium fluoride (LiF) was formed on the second electron transport layer of the electron transport layer by a vacuum deposition method, thereby forming an electron injection layer having an average thickness of 1 nm.

<8A> Next, a film of Al was formed on the electron injection layer by a vacuum deposition method. Accordingly, a cathode having an average thickness of 150 nm, which is made of Al was formed.

<9A> Next, the formed layers were covered with a protective cover (sealing member) made of glass and fixed and sealed with an epoxy resin.

The light-emitting elements were produced by the above-described processes.

Example 2A

A light-emitting element was produced by the same processes as those of Example 1A described above except that the mixing ratio (ratio by weight) of the benzidine derivative to the anthracene derivative in the hole injection layer and the hole transport layer was (benzidine derivative):(anthracene derivative)=80:20.

Example 3A

A light-emitting element was produced by the same processes as those of Example 1A described above except that the mixing ratio (ratio by weight) of the benzidine derivative to the anthracene derivative in the hole injection layer and the hole transport layer was (benzidine derivative):(anthracene derivative)=60:40.

Example 4A

A light-emitting element was produced by the same processes as those of Example 1A described above except that the mixing ratio (ratio by weight) of the benzidine derivative to the anthracene derivative in the hole injection layer and the hole transport layer was (benzidine derivative):(anthracene derivative)=50:50.

Example 5A

A light-emitting element was produced by the same processes as those of Example 1A described above except that the mixing ratio (ratio by weight) of the benzidine derivative to the anthracene derivative in the hole injection layer and the hole transport layer was (benzidine derivative):(anthracene derivative)=40:60.

Example 6A

A light-emitting element was produced by the same processes as those of Example 1A described above except that the mixing ratio (ratio by weight) of the benzidine derivative to the anthracene derivative in the hole injection layer and the hole transport layer was (benzidine derivative):(anthracene derivative)=30:70.

Example 7A

A light-emitting element was produced by the same processes as those of Example 1A described above except that the mixing ratio (ratio by weight) of the benzidine derivative to the anthracene derivative in the hole injection layer and the hole transport layer was (benzidine derivative):(anthracene derivative)=20:80.

Example 8A

A light-emitting element was produced by the same processes as those of Example 1A described above except that the hole transport layer was omitted, the average thickness of the hole injection layer was 70 nm, and the mixing ratio (ratio by weight) of the benzidine derivative to the anthracene derivative in the hole injection layer was (benzidine derivative):(anthracene derivative)=40:60.

Example 9A

A light-emitting element was produced by the same processes as those of Example 1A described above except that the hole injection layer was omitted, the average thickness of the hole transport layer was 70 nm, and the mixing ratio (ratio by weight) of the benzidine derivative to the anthracene derivative in the hole transport layer was (benzidine derivative):(anthracene derivative)=40:60.

Comparative Example A

A light-emitting element was produced by the same processes as those of Example 1A described above except that blending of the anthracene derivative (electron-transporting material) with the hole injection layer and the hole transport layer was omitted.

Example 1B

<1B> First, a transparent glass substrate having an average thickness of 0.5 mm was prepared. Next, an ITO electrode (anode) having an average thickness of 100 μm was formed on the substrate by a sputtering method.

The substrate was immersed in acetone and 2-propanol in this order to perform ultrasonic cleaning, and then subjected to an oxygen plasma treatment and an argon plasma treatment. The plasma treatments were performed by a plasma power of 100 W, at a gas flow rate of 20 sccm, for a treatment time of 5 sec in a state where the substrate was warmed to 70 to 90° C.

<2B> Next, the benzidine derivative (hole-injecting material) expressed by Formula 1 was deposited on the ITO electrode by a vacuum deposition method, thereby forming a hole injection layer having an average thickness of 40 μm.

<3B> Next, the benzidine derivative (hole-transporting material) expressed by Formula 11 was deposited on the hole injection layer by a vacuum deposition method, thereby forming a hole transport layer having an average thickness of 10 μm.

<4B> Next, the benzidine derivative (hale-transporting material) expressed by Formula 11 and the anthracene derivative (electron-trapping material) expressed by Formula 12 were co-deposited on the hole transport layer by a vacuum deposition method, thereby forming an electron neutralization layer having an average thickness of 20 nm.

Here, the electron neutralization layer was made of a material in which the benzidine derivative (hole-transporting material) expressed by Formula 11 and the anthracene derivative (electron-trapping material) expressed by Formula 12 were mixed with each other. The mixing ratio (ratio by weight) was (benzidine derivative):(anthracene derivative)=50:50.

<5B> Next, a constituent material of a red-light-emitting layer was deposited on the electron neutralization layer by a vacuum deposition method, thereby forming a red-light-emitting layer (light-emitting layer) having an average thickness of 40 nm. As the constituent material of the red-light-emitting layer, the tetraaryldiindenoperylene derivative expressed by Formula 3 was used as the red-light-emitting material (guest material), and the naphthacene derivative expressed by Formula 7 was used as a host material. In addition, the content (doping concentration) of the light-emitting material (dopant) in the red-light-emitting layer was 1.0 wt %.

<6B> Next, a film of tris(8-quinolinolato)aluminum ($Alq_3$) expressed by Formula 9 was formed on the red-light-emitting layer by a vacuum deposition method, thereby forming a first electron transport layer having an average thickness of 5 μm.

<7B> Next, a film of the azaindolizine derivative expressed by Formula 10 was formed on the first electron transport layer by a vacuum deposition method, thereby forming a second electron transport layer having an average thickness of 25 μm.

Accordingly, an electron transport layer in which the first and second electron transport layers are laminated was obtained.

<8B> Next, a film of lithium fluoride (LiF) was formed on the second electron transport layer of the electron transport layer by a vacuum deposition method, thereby forming an electron injection layer having an average thickness of 1 nm.

<9B> Next, a film of Al was formed on the electron injection layer by a vacuum deposition method. Accordingly, a cathode having an average thickness of 150 nm, which was made of Al was formed.

<10B> Next, the formed layers were covered with a protective cover (sealing member) made of glass and fixed and sealed with an epoxy resin.

The light-emitting elements were produced by the above-described processes.

Example 2B

A light-emitting element was produced by the same processes as those of Example 1B described above except that the average thickness of the hole injection layer was 30 nm and the average thickness of the electron neutralization layer was 30 nm.

Example 3B

A light-emitting element was produced by the same processes as those of Example 1B described above except that the average thickness of the hole injection layer was 10 nm and the average thickness of the electron neutralization layer was 50 nm.

Example 4B

A light-emitting element was produced by the same processes as those of Example 1B described above except that the average thickness of the hole injection layer was 5 nm, the average thickness of the hole transport layer was 5 nm, and the average thickness of the electron neutralization layer was 60 nm.

Example 5B

A light-emitting element was produced by the same processes as those of Example 1B described above except that the average thickness of the hole injection layer was 10 nm, the average thickness of the electron neutralization layer was 50 μm, and the mixing ratio (ratio by weight) of the benzidine derivative to the anthracene derivative in the electron neutralization layer was (benzidine derivative):(anthracene derivative)=70:30.

Example 6B

A light-emitting element was produced by the same processes as those of Example 1B described above except that the average thickness of the hole injection layer was 10 nm, the average thickness of the electron neutralization layer was 50 nm, and the mixing ratio (ratio by weight) of the benzidine derivative to the anthracene derivative in the electron neutralization layer was (benzidine derivative):(anthracene derivative)=40:60.

Example 7B

A light-emitting element was produced by the same processes as those of Example 18 described above except that the average thickness of the hole injection layer was 10 nm, the average thickness of the electron neutralization layer was 50 nm, and the mixing ratio (ratio by weight) of the benzidine derivative to the anthracene derivative in the electron neutralization layer was (benzidine derivative):(anthracene derivative)=20:80.

Reference Example B

A light-emitting element was produced by the same processes as those of Example 18 described above except that the average thickness of the hole injection layer was 50 nm and the average thickness of the electron neutralization layer was 10 nm.

Comparative Example B

A light-emitting element was produced by the same processes as those of Example 1B described above except that the average thickness of the hole injection layer was 60 μm and the electron neutralization layer was omitted.

Example 1C

<1C> First, a transparent glass substrate having an average thickness of 0.5 mm was prepared. Next, an ITO electrode (anode) having an average thickness of 100 nm was formed on the substrate by a sputtering method.

The substrate was immersed in acetone and 2-propanol in this order to perform ultrasonic cleaning, and then subjected to an oxygen plasma treatment and an argon plasma treatment. The plasma treatments were performed by a plasma power of 100 W, at a gas flow rate of 20 sccm, for a treatment time of 5 sec in a state where the substrate was warmed to 70 to 90° C.

<2C> Next, the benzidine derivative (hole-injecting material) expressed by Formula 1 was deposited on the ITO electrode by a vacuum deposition method, thereby forming a hole injection layer having an average thickness of 40 nm.

<3C> Next, the benzidine derivative (hole-transporting material) expressed by Formula 11 and the anthracene derivative (electron-trapping material) expressed by Formula 12 were co-deposited on the hole injection layer by a vacuum deposition method, thereby forming an electron neutralization layer having an average thickness of 20 μm.

Here, the electron neutralization layer was made of a material in which the benzidine derivative (hole-transporting material) expressed by Formula 11 and the anthracene derivative (electron-trapping material) expressed by Formula 12 were mixed with each other. The mixing ratio (ratio by weight) was (benzidine derivative):(anthracene derivative)=50:50.

<4C> Next, the benzidine derivative (hole-transporting material) expressed by Formula 11 was deposited on the electron neutralization layer by a vacuum deposition method, thereby forming a hole transport layer having an average thickness of 10 nm.

<5C> Next, a constituent material of a red-light-emitting layer was deposited on the hole transport layer by a vacuum deposition method, thereby forming a red-light-emitting layer (light-emitting layer) having an average thickness of 40 nm. As the constituent material of the red-light-emitting layer, the tetraaryldiindenoperylene derivative expressed by Formula 3 was used as the red-light-emitting material (guest material), and the naphthacene derivative expressed by Formula 7 was used as a host material. In addition, the content (doping concentration) of the light-emitting material (dopant) in the red-light-emitting layer was 1.0 wt %.

C> Next, a film of tris(8-quinolinolato)aluminum ($Alq_3$) expressed by Formula 9 was formed on the red-light-emitting layer by a vacuum deposition method, thereby forming a first electron transport layer having an average thickness of 5 nm.

<7C> Next, a film of the azaindolizine derivative expressed by Formula 10 was formed on the first electron transport layer by a vacuum deposition method, thereby forming a second electron transport layer having an average thickness of 25 nm.

Accordingly, an electron transport layer in which the first and second electron transport layers were laminated was obtained.

<8C> Next, a film of lithium fluoride (LiF) was formed on the second electron transport layer of the electron transport layer by a vacuum deposition method, thereby forming an electron injection layer having an average thickness of 1 nm.

<9C> Next, a film of Al was formed on the electron injection layer by a vacuum deposition method. Accordingly, a cathode having an average thickness of 150 nm, which is made of Al was formed.

<10C> Next, the formed layers were covered with a protective cover (sealing member) made of glass and fixed and sealed with an epoxy resin.

The light-emitting elements were produced by the above-described processes.

Example 2C

A light-emitting element was produced by the same processes as those of Example 1C described above except that the average thickness of the hole injection layer was 30 nm and the average thickness of the electron neutralization layer was 30 nm.

Example 3C

A light-emitting element was produced by the same processes as those of Example 1C described above except that the average thickness of the hole injection layer was 10 nm and the average thickness of the electron neutralization layer was 50 nm.

Example 4C

A light-emitting element was produced by the same processes as those of Example 1C described above except that the average thickness of the hole injection layer was 5 nm, the average thickness of the electron neutralization layer was 60 nm, and the average thickness of the hole transport layer was 5 nm.

Example 5C

A light-emitting element was produced by the same processes as those of Example 1C described above except that the average thickness of the hole injection layer was 30 nm, the average thickness of the electron neutralization layer was 30 nm, and the mixing ratio (ratio by weight) of the benzidine derivative to the anthracene derivative in the electron neutralization layer was (benzidine derivative):(anthracene derivative)=70:30.

Example 6C

A light-emitting element was produced by the same processes as those of Example 1C described above except that the average thickness of the hole injection layer was 30 nm, the average thickness of the electron neutralization layer was 30 nm, and the mixing ratio (ratio by weight) of the benzidine derivative to the anthracene derivative in the electron neutralization layer was (benzidine derivative):(anthracene derivative)=30:70.

Example 7C

A light-emitting element was produced by the same processes as those of Example 1C described above except that the average thickness of the hole injection layer was 30 nm, the average thickness of the electron neutralization layer was 30 nm, and the tetracene derivative expressed by Formula 7 was used in the electron neutralization layer as the electron-trapping material instead of the anthracene derivative.

Example 8C

A light-emitting element was produced by the same processes as those of Example 1C described above except that the average thickness of the hole injection layer was 30 nm, the average thickness of the electron neutralization layer was 30 nm, and the tetraaryldiindenoperylene derivative expressed by Formula 3 was used in the electron neutralization layer as the electron-trapping material instead of the anthracene derivative.

Reference Example C

A light-emitting element was produced by the same processes as those of Example 1C described above except that the average thickness of the hole injection layer was 50 nm and the average thickness of the electron neutralization layer was 10 nm.

Comparative Example C

A light-emitting element was produced by the same processes as those of Example 1C described above except that the average thickness of the hole injection layer was 60 nm and the electron neutralization layer was omitted.

2. Evaluation 2-1. Evaluation of Light-Emission Lifetime

In each of Reference Examples, Examples, and Comparative Example, a constant current was supplied to each of the light-emitting elements using a direct-current power supply at such a current density that the initial luminance became 60,000 cd/m$^2$. During that time, the luminance was measured using the luminance meter, and a time (LT90) taken for the luminance to decrease to 90% of the initial luminance was measured. The time of LT90 in Comparative Example was standardized as 1.00, and the time of LT90 in each of the corresponding Reference Examples, Examples, and Comparative Example was relatively evaluated.

2-2. Evaluation of Light-Emission Efficiency

While the luminance of the light-emitting element in each of Reference Examples, Examples, and Comparative Example was measured using a luminance meter, a current was supplied to each of the light-emitting elements using a direct-current power supply so that the initial luminance became 60,000 cd/m$^2$, and the current at that time was measured. The driving voltage applied to the light-emitting element at that point was measured in a similar manner.

2-3. Evaluation of Light-Emission Balance

While the luminance of the light-emitting element in each of Reference Examples, Examples, and Comparative Example was measured using a luminance meter, a current was supplied to each of the light-emitting elements using a direct-current power supply so that the luminance became 60,000 cd/m$^2$, and the chromaticity at that time was measured using a chromaticity meter.

The evaluation results are shown in Tables 1 to 3.

TABLE 1

| | Hole injection layer | | | Hole transport layer | | | Evaluation | | | |
|---|---|---|---|---|---|---|---|---|---|---|
| | Constituent material | | | Constituent material | | | | | | |
| | Content of hole-injecting material [wt %] | Content of electron-transporting material [wt %] | Average thickness [nm] | Content of hole-transporting material [wt %] | Content of electron-transporting material [wt %] | Average thickness [nm] | Driving voltage [V] | Current density [mA/cm²] | Chromaticity (x, y) | Lifetime (LT90) standardized in Comparative Example |
| Ex. 1A | 90 | 10 | 20 | 90 | 10 | 50 | 9.7 | 1210 | (0.63, 0.32) | 1.4 |
| Ex. 2A | 80 | 20 | 20 | 80 | 20 | 50 | 9.8 | 1230 | (0.66, 0.33) | 1.6 |
| Ex. 3A | 60 | 40 | 20 | 60 | 40 | 50 | 10.0 | 1240 | (0.67, 0.33) | 2.0 |
| Ex. 4A | 50 | 50 | 20 | 50 | 50 | 50 | 10.1 | 1250 | (0.67, 0.33) | 3.0 |
| Ex. 5A | 40 | 60 | 20 | 40 | 60 | 50 | 10.2 | 1290 | (0.67, 0.33) | 3.5 |
| Ex. 6A | 30 | 70 | 20 | 30 | 70 | 50 | 10.6 | 1350 | (0.67, 0.33) | 2.8 |
| Ex. 7A | 20 | 80 | 20 | 20 | 80 | 50 | 12.3 | 1520 | (0.67, 0.33) | 1.5 |
| Ex. 8A | 40 | 60 | 70 | — | — | 0 | 10.1 | 1280 | (0.67, 0.33) | 3.0 |
| Ex. 9A | — | — | — | 40 | 60 | 70 | 10.1 | 1280 | (0.67, 0.33) | 3.8 |
| Comp. Ex. A | 100 | 0 | 20 | 100 | 0 | 50 | 9.5 | 1180 | (0.67, 0.33) | 1.0 |

TABLE 2

| | Hole injection layer Average thickness [nm] | Hole transport layer Average thickness [nm] | Electron neutralization layer | | | Evaluation | | | |
|---|---|---|---|---|---|---|---|---|---|
| | | | Content of hole-transporting material [wt %] | Content of electron-trapping material [wt %] | Average thickness [nm] | Lifetime (LT90) standardized in Comparative Example | Current density [mA/cm²] | Initial voltage [V] | Chromaticity (CIE1931) (x, y) |
| Ex. 1B | 40 | 10 | 50 | 50 | 20 | 1.1 | 1210 | 9.7 | (0.66, 0.33) |
| Ex. 2B | 30 | 10 | 50 | 50 | 30 | 1.4 | 1250 | 10.1 | (0.66, 0.33) |
| Ex. 3B | 10 | 10 | 50 | 50 | 50 | 1.7 | 1300 | 10.3 | (0.66, 0.33) |
| Ex. 4B | 5 | 5 | 50 | 50 | 60 | 1.6 | 1400 | 10.5 | (0.66, 0.33) |
| Ex. 5B | 10 | 10 | 70 | 30 | 50 | 1.2 | 1200 | 10.0 | (0.66, 0.33) |
| Ex. 6B | 10 | 10 | 40 | 60 | 50 | 1.75 | 1300 | 10.3 | (0.66, 0.33) |
| Ex. 7B | 10 | 10 | 20 | 80 | 50 | 1.6 | 1350 | 10.5 | (0.66, 0.33) |
| Ref. Ex. B | 50 | 10 | 50 | 50 | 10 | 0.9 | 1200 | 9.7 | (0.66, 0.33) |
| Comp. Ex. B | 60 | 10 | — | — | — | 1.0 | 1180 | 9.4 | (0.66, 0.33) |

TABLE 3

| | Hole injection layer Average thickness [nm] | Electron neutralization layer | | | Hole transport layer Average thickness [nm] | Evaluation | | | |
|---|---|---|---|---|---|---|---|---|---|
| | | Content of hole-transporting material [wt %] | Content of electron-trapping material [wt %] | Average thickness [nm] | | Lifetime (LT90) standardized in Comparative Example | Current density [mA/cm²] | Initial voltage [V] | Chromaticity (CIE1931) (x, y) |
| Ex. 1C | 40 | 50 | 50 (anthracene-based) | 20 | 10 | 1.5 | 1250 | 10.1 | (0.66, 0.33) |
| Ex. 2C | 30 | 50 | 50 (anthracene-based) | 30 | 10 | 1.9 | 1300 | 10.5 | (0.66, 0.33) |
| Ex. 3C | 10 | 50 | 50 (anthracene-based) | 50 | 10 | 1.6 | 1250 | 11.0 | (0.66, 0.33) |
| Ex. 4C | 5 | 50 | 50 (anthracene-based) | 60 | 5 | 1.4 | 1240 | 10.9 | (0.66, 0.33) |
| Ex. 5C | 30 | 70 | 30 (anthracene-based) | 30 | 10 | 1.8 | 1200 | 10.2 | (0.66, 0.33) |
| Ex. 6C | 30 | 30 | 70 (anthracene-based) | 30 | 10 | 1.7 | 1350 | 11.0 | (0.66, 0.33) |
| Ex. 7C | 30 | 50 | 50 (tetracene-based) | 30 | 10 | 2.0 | 1300 | 10.8 | (0.66, 0.33) |
| Ex. 8C | 30 | 50 | 50 (light-emitting material) | 30 | 10 | 1.8 | 1300 | 11.2 | (0.66, 0.33) |

TABLE 3-continued

| | Hole injection layer Average thickness [nm] | Electron neutralization layer | | Hole transport layer Average thickness [nm] | Evaluation | | | |
|---|---|---|---|---|---|---|---|---|
| | | Content of hole-transporting material [wt %] | Content of electron-trapping material [wt %] | | Lifetime (LT90) standardized in Comparative Example | Current density [mA/cm$^2$] | Initial voltage [V] | Chromaticity (CIE1931) (x, y) |
| Ref. Ex. C | 50 | 50 | 50 (anthracene-based) | 10 | 1.0 | 1200 | 9.9 | (0.66, 0.33) |
| Comp. Ex. C | 60 | — | — | — | 1.0 | 1180 | 9.4 | (0.66, 0.33) |

As apparent from Table 1, it was found that the light-emitting element in each of Examples had an extremely long lifetime compared to the light-emitting element in Comparative Example. In addition, the light-emitting element in each of Examples was able to emit light at the same driving voltage and the same current density as those of the light-emitting element in the Comparative Example A and thus had excellent light-emission efficiency. In particular, the light-emitting element in each of Examples 2A to 9A was able to emit light with the same chromaticity as that of Comparative Example A, thereby obtaining a desired light-emission color. In particular, an effect of long lifetime was able to be obtained when the content of the electron-transporting material was in the range of 50 to 70 wt %, and an effect of the longest lifetime was obtained when the content of the electron-transporting material was 60 wt %. In addition, the same effect was obtained even when either the hole injection layer or the hole transport layer was not used.

In addition, as apparent from Table 2, it was found that the light-emitting element in each of Examples 1B to 7B had a long lifetime compared to the light-emitting elements in Reference Example B and Comparative Example B.

In addition, as apparent from Table 3, it was found that the light-emitting element in each of Examples 1C to 8C had a long lifetime compared to the light-emitting elements in Reference Example C and Comparative Example C.

The entire disclosure of Japanese Patent Application No.: 2010-199311, filed Sep. 6, 2010, 2010-215080, filed Sep. 27, 2010, and 2010-215081, filed Sep. 27, 2010 are expressly incorporated by reference herein.

What is claimed is:

1. A light-emitting element comprising:
an anode;
a cathode;
a light-emitting layer disposed between the anode and the cathode, the light-emitting layer configured to emit light if the anode and the cathode are electrically connected to each other; and
an organic layer disposed between and contacting the anode and the light-emitting layer, the organic layer having a first function of transporting holes and a second function of preventing electrons infiltrating from the light-emitting layer from staying in the organic layer, the entirety of the organic layer contains an electron-transporting material that has a property of transporting electrons and accordingly exhibits the second function, and a content of the electron-transporting material in the organic layer is equal to or greater than 40 wt % and equal to or smaller than 70 wt %.

2. The light-emitting element according to claim 1, wherein the organic layer exhibits a function of blocking electrons by the first function.

3. The light-emitting element according to claim 1, wherein the organic layer contains an amine-based material and accordingly exhibits the first function.

4. The light-emitting element according claim 1, wherein the electron-transporting material is an acene-based material.

5. The light-emitting element according to claim 4, wherein the acene-based material is made of at least one of an anthracene-based material and a naphthacene-based material.

6. The light-emitting element according claim 1,
wherein the organic layer includes a hole injection layer which is provided between the anode and the light-emitting layer to come in contact with the anode and contains a hole-injecting material, and a hole transport layer which is provided between the hole injection layer and the light-emitting layer to come in contact with both layers and contains a hole-transporting material, and
the electron-transporting material is contained in each of the hole injection layer and the hole transport layer.

7. The light-emitting element according to claim 1,
wherein the organic layer includes a hole injection layer which is provided between the anode and the light-emitting layer to come in contact with both layers and contains a hole-injecting material, and
the electron-transporting material is contained in the hole injection layer.

8. The light-emitting element according to claim 1,
wherein the organic layer includes a hole transport layer which is provided between the anode and the light-emitting layer to come in contact with both layers and contains a hole-transporting material, and
the electron-transporting material is contained in the hole transport layer.

9. The light-emitting element according to claim 1, wherein the organic layer contains an electron-trapping material having a property of trapping electrons and accordingly exhibits the second function.

10. The light-emitting element according to claim 9, wherein the electron-trapping material is an acene-based material.

11. The light-emitting element according to claim 9, wherein the organic layer has an electron neutralization layer containing a hole-transporting material and the electron-trapping material.

12. The light-emitting element according to claim 11,
wherein the organic layer further includes a hole injection layer provided between the anode and the light-emitting layer and a hole transport layer provided between the hole injection layer and the light-emitting layer, and
the electron neutralization layer is provided between the hole transport layer and the light-emitting layer to come in contact with the light-emitting layer.

13. The light-emitting element according to claim 11,
wherein the organic layer further includes a hole injection layer provided between the anode and the light-emitting layer and a hole transport layer provided between the hole injection layer and the light-emitting layer, and the electron neutralization layer is provided between the hole injection layer and the hole transport layer to come in contact with both the layers.

14. The light-emitting element according to claim 13, wherein the hole transport layer has a function of blocking electrons.

15. A light-emitting device including the light-emitting element according to claim 1.

16. A display device including the light-emitting device according to claim 15.

17. An electronic apparatus including the display device according to claim 16.

* * * * *